(12) United States Patent
Matsui et al.

(10) Patent No.: US 8,405,139 B2
(45) Date of Patent: Mar. 26, 2013

(54) NONVOLATILE SEMICONDUCTOR MEMORY DEVICE HAVING ELEMENT ISOLATING REGION OF TRENCH TYPE

(75) Inventors: Michiharu Matsui, Fujisawa (JP); Seiichi Mori, Tokyo (JP); Riichiro Shirota, Fujisawa (JP); Yuji Takeuchi, Yokohama (JP); Takeshi Kamigaichi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 78 days.

(21) Appl. No.: 13/085,884

(22) Filed: Apr. 13, 2011

(65) Prior Publication Data

US 2011/0186921 A1    Aug. 4, 2011

Related U.S. Application Data

(60) Continuation of application No. 12/435,842, filed on May 5, 2009, now Pat. No. 7,939,406, which is a continuation of application No. 11/556,299, filed on Nov. 3, 2006, now Pat. No. 7,538,380, which is a division of application No. 11/399,657, filed on Apr. 7, 2006, now Pat. No. 7,348,627, which is a division of application No. 11/168,410, filed on Jun. 29, 2005, now Pat. No. 7,049,653, which is a division of application No. 10/991,521, filed on Nov. 19, 2004, now Pat. No. 6,927,449, which is a division of application No. 09/956,986, filed on Sep. 21, 2001, now Pat. No. 6,835,978.

(30) Foreign Application Priority Data

Sep. 26, 2000 (JP) ................................. 2000-291910
Sep. 7, 2001 (JP) ................................. 2001-272224

(51) Int. Cl.
*H01L 29/788* (2006.01)

(52) U.S. Cl. ........ 257/316; 257/317; 257/319; 257/321; 257/E29.3

(58) Field of Classification Search .................. 257/316, 257/317, 319, 321
See application file for complete search history.

(56) References Cited

U.S. PATENT DOCUMENTS

| 4,780,431 A | 10/1988 | Maggioni et al. |
| 5,326,999 A | 7/1994 | Kim et al. |
| 5,793,081 A | 8/1998 | Tomioka et al. |

(Continued)

FOREIGN PATENT DOCUMENTS

| EP | 0 255 159 | 2/1988 |
| JP | 63-034977 | 2/1988 |

(Continued)

OTHER PUBLICATIONS

Office Action issued Jan. 31, 2012, in Japanese Patent Application No. 2009-160808 (with English-language Translation).

(Continued)

*Primary Examiner* — Thien F Tran
(74) *Attorney, Agent, or Firm* — Oblon, Spivak, McClelland, Maier & Neustadt, L.L.P.

(57) ABSTRACT

Disclosure is semiconductor device of a selective gate region, comprising a semiconductor layer, a first insulating film formed on the semiconductor layer, a first electrode layer formed on the first insulating layer, an element isolating region comprising an element isolating insulating film formed to extend through the first electrode layer and the first insulating film to reach an inner region of the semiconductor layer, the element isolating region isolating a element region and being self-aligned with the first electrode layer, a second insulating film formed on the first electrode layer and the element isolating region, an open portion exposing a surface of the first electrode layer being formed in the second insulating film, and a second electrode layer formed on the second insulating film and the exposed surface of the first electrode layer, the second electrode layer being electronically connected to the first electrode layer via the open portion.

24 Claims, 33 Drawing Sheets

U.S. PATENT DOCUMENTS

| | | | |
|---|---|---|---|
| 6,221,717 B1 | 4/2001 | Cremonesi et al. | |
| 6,327,179 B1 | 12/2001 | Osari | |
| 6,342,715 B1 | 1/2002 | Shimizu et al. | |
| 6,420,754 B2 | 7/2002 | Takahashi et al. | |
| 6,461,916 B1 | 10/2002 | Adachi et al. | |
| 7,061,044 B2 | 6/2006 | Park et al. | |
| 7,352,027 B2 * | 4/2008 | Matsui et al. | 257/316 |
| 2010/0065900 A1 | 3/2010 | Murata et al. | |

FOREIGN PATENT DOCUMENTS

| | | |
|---|---|---|
| JP | 2-1176 | 1/1990 |
| JP | 3-283570 | 12/1991 |
| JP | 05-206292 | 8/1993 |
| JP | 6-125090 | 5/1994 |
| JP | 08-204147 | 8/1996 |
| JP | 09-064203 | 3/1997 |
| JP | 11-026731 | 1/1999 |
| JP | 11-97652 | 4/1999 |
| JP | 11-163304 | 6/1999 |
| JP | 11-177066 | 7/1999 |
| JP | 11-186379 | 7/1999 |
| JP | 2000-183308 | 6/2000 |
| JP | 2000-223596 | 8/2000 |
| JP | 2000-243937 | 9/2000 |
| JP | 2000-269468 | 9/2000 |

OTHER PUBLICATIONS

Office Action issued Jan. 31, 2012, in Japanese Patent Application No. 2009-160809 (with English-language Translation).

Office Action issued May 8, 2012, in Japanese Patent Application No. 2009-160808, (with English-language Translation).

* cited by examiner

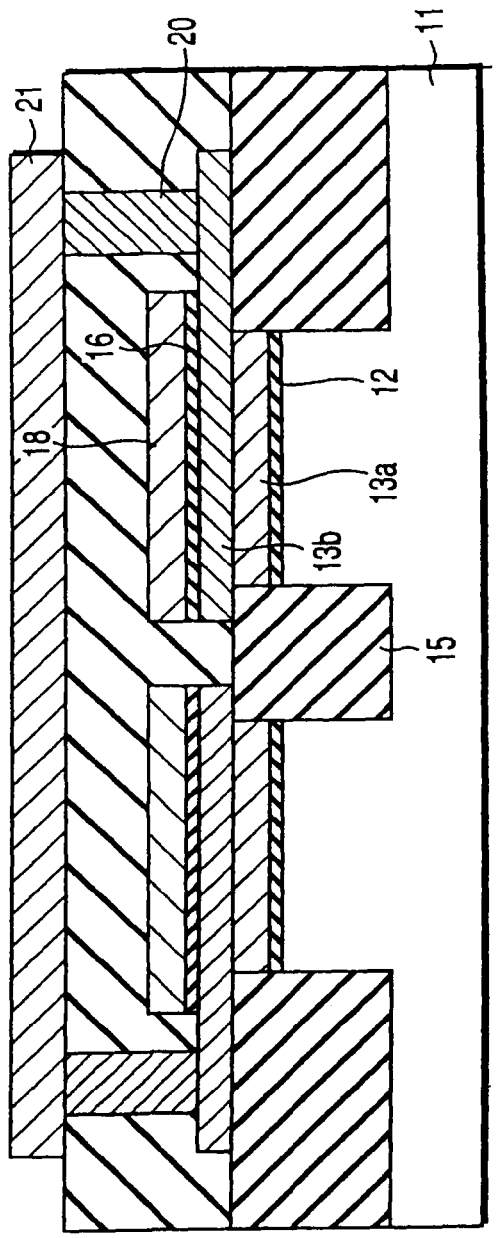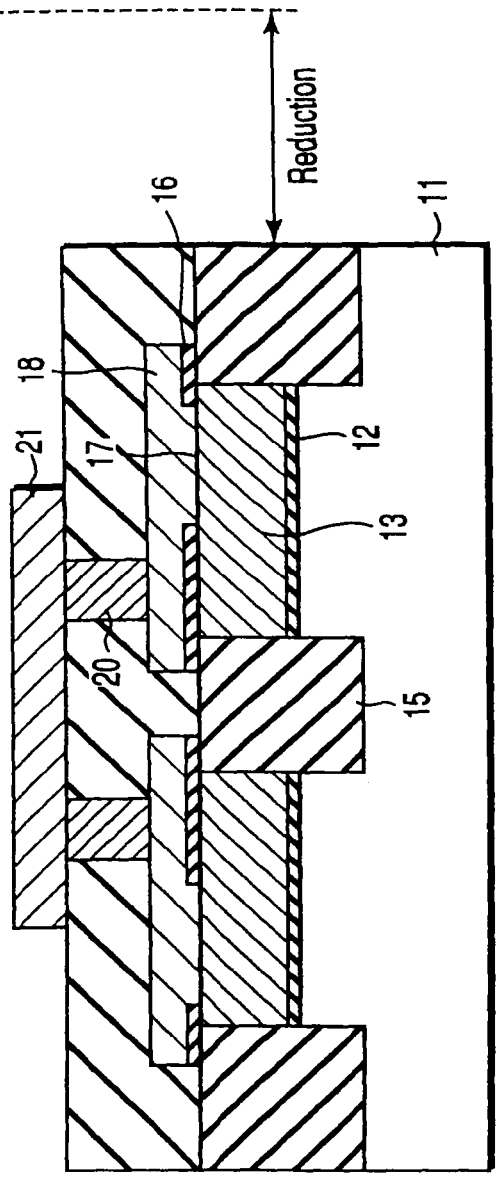
FIG. 30A
FIG. 30B

Selective gate region

NONVOLATILE SEMICONDUCTOR MEMORY DEVICE HAVING ELEMENT ISOLATING REGION OF TRENCH TYPE

CROSS-REFERENCE TO RELATED APPLICATIONS

This application is a continuation of and claims the benefit of priority from U.S. Ser. No. 12/435,842 filed May 5, 2009, which is a continuation of and claims the benefit of priority from U.S. Ser. No. 11/556,299 filed Nov. 3, 2006, which is a division of and claims the benefit of priority from U.S. Ser. No. 11/399,657 filed Apr. 7, 2006, which is a division of U.S. Ser. No. 11/168,410 filed Jun. 29, 2005, which is a division of U.S. Pat. No. 6,927,449, issued Aug. 9, 2005, which is a division of U.S. Pat. No. 6,835,978, issued Dec. 28, 2004, and is based upon and claims the benefit of priority from the prior Japanese Patent Applications No. 2000-291910, filed Sep. 26, 2000, and No. 2001-272224, filed Sep. 7, 2001, the entire contents of each of which are incorporated herein by reference.

BACKGROUND OF THE INVENTION

1. Field of the Invention

The present invention relates to a nonvolatile semiconductor memory device and a method of manufacturing the same, particularly, to a gate structure of a semiconductor device having a nonvolatile memory transistor including a floating gate and a control gage, a selective transistor arranged close to said memory transistor, and a peripheral circuit mounted on the same chip.

2. Description of the Related Art

Known is a flash memory having a memory transistor including a floating gate and a control gate, a selective transistor arranged close to the memory transistor, and a peripheral circuit for driving the memory transistor and the selective transistor mounted to the same chip. A typical flash memory is called a NAND type flash memory. The NAND type flash memory includes a plurality of memory transistors connected in series, a selective transistor arranged close to the both edge portions of the memory transistor, and a peripheral circuit transistor for driving the memory transistor and the selective transistor. The region in which are arranged the memory transistors is called a memory cell array region, the region in which is arranged the selective transistor is called a selective gate region, and the region in which is arranged the peripheral circuit transistor is called a peripheral circuit region.

The method of preparing the flash memory of this type includes, for example, the steps of forming a gate insulating film on a semiconductor layer, depositing a polycrystalline silicon (polysilicon) film providing the floating gate of the memory transistor on the gate insulating film, and forming an element isolating region. In this case, a gate electrode of a two layer structure consisting of a floating gate and a control gate is present in at least a portion of the selective gate region and the peripheral circuit region as in the memory cell array region. It should be noted that it is necessary for the transistor in the selective gate region and the peripheral circuit region to be electrically connected to an upper wiring by withdrawing the floating gate. A conventional semiconductor device of this type will now be described.

FIG. 46A is a plan view showing the memory cell array region and the selective gate region of the semiconductor device according to the first prior art. FIG. 46B is a plan view showing the peripheral circuit region of the semiconductor device according to the first prior art. FIG. 47A is cross sectional view of the semiconductor device along the line XXXXVIIA-XXXXVIIA shown in FIGS. 46A and 46B. FIG. 47B is cross sectional view of the semiconductor device along the line XXXXVIIB-XXXXVIIB shown in FIG. 46A. The first a prior art is disclosed in Japanese Patent Disclosure (Kokai) No. 11-163304.

As shown in FIGS. 46A, 46B, 47A and 47B, a first insulating film 12 is formed on a semiconductor layer 11, and a first floating gate electrode layer 13a is formed on the first insulating film 12. Then, an element isolating groove is formed and the element isolating groove thus formed is filled with an insulating film. The insulating film if planarized until the first floating gate electrode layer 13a is exposed to the outside so as to form an element isolating region 15. Then, a second floating gate layer 13b consisting of polysilicon is formed on the first floating gate layer 13a and the element isolating region 15, followed by patterning the second floating gate electrode layer 13b by a lithography and an etching. Consequently, an open portion 50 is formed on the element isolating region 15 of the memory sell array region and the open portion 50 isolated the second floating gate electrode layer 13b. Further, a second insulating film 16 is formed on the second floating gate electrode layer 13b and the element isolating region 15, followed by forming a control gate electrode layer 18 on the second insulating film 16. After the control gate electrode layer 18, the second insulating film 16 and the first and second floating gate electrode layers 13a and 13b are patterned, a third insulating film 19 is formed on the entire surface of the semiconductor layer 11. Further, after a contact hole is formed in the third insulating film 19, a wiring 21 connected to the contact hole 20 is formed. As a result, the wiring 21 is connected to the control gate electrode layer 18 via the contact hole 20 in the memory cell array region, and the wiring 21 is connected to the first and second floating gate electrode layers 13a, 13b via the contact hole 20 in the selective gate region and the peripheral circuit region.

The semiconductor device according to the first prior art described above comprises a floating gate of the double layer structure consisting of the first and second floating gate electrode layers 13a and 13b. In the floating gate of the particular construction, the first floating gate electrode layer 13a is self-aligned with the element isolating region 15, and the second floating gate electrode layer 13b is pulled up onto the element isolating region 15. However, the first prior art described above gives rise to problems.

First of all, in the memory cell array region, it was necessary to set the width P of the open portion 50 such that the open portion 50 is not buried with the second insulating film 16. It was also necessary to ensure an aligning allowance Q between the open portion 50 and the element region 10 in the lithography. However, it was difficult to finely adjust the open portion 50 because of the limit in the resolution of the photoresist in patterning the open portion 50. As a result, it was difficult to achieve the fineness beyond a certain level, with the result that it was difficult to make the memory cell finer.

On the other hand, in the peripheral circuit region, the contact hole 20 is formed on the element isolating region 15, making it possible to avoid the damage done to the element region. However, the element region is formed a long distance away from the connecting portion 25 between the second floating gate electrode layer 13b and the contact hole 20. Therefore, since the second floating gate electrode layer 13b is formed of in general an electrode material having a high resistivity such as polysilicon, the delay caused by the resistance is increased so as to lower the performance of the element. It should also be noted that, if the second floating gate electrode layer 13b is allowed to extend over the element isolating region 15, a capacitance coupling is formed between the semiconductor layer 11 and the floating gate with the insulating film of the element isolating region 15 interposed therebetween, leading to an increased RC delay.

Particularly, when it comes to the selective transistor of the NAND type flash memory, the increase in the RC delay described above is a serious problem to be solved. The contact to the second floating gate electrode layer 13b is formed as required for several cells within the memory cell array. The contact portion requires an area so as to increase the area of the memory cell array. Also, since the contact hole 20 can be formed in only a part of the memory cell array, the contact hole 20 is connected to the transistor via the second floating gate electrode layer 13b formed of polysilicon having a high resistivity. It follows that the problem of the RC delay time to the transistor positioned remote from the contact hole 20 is rendered serious. It should be noted that the increase in the delay time of the selective transistor adversely affects the reading speed of the memory cell.

FIG. 48A is a plan view showing the memory cell array region and the selective gate region of the semiconductor device according to the second prior art. FIG. 48B is a plan view showing the peripheral circuit region of the semiconductor device according to the second prior art. FIG. 49A is cross sectional view of the semiconductor device along the line XXXXIXA-XXXXIXA shown in FIGS. 48A and 48B. FIG. 49B is cross sectional view of the semiconductor device along the line XXXXIXB-XXXXIXB shown in FIG. 48A. The second prior art is intended to avoid the problem inherent in the first prior art that it is difficult to make the memory cell portion finer.

As shown in the drawing, a first insulating film 12 is formed on a semiconductor layer 11, and a floating gate electrode layer 13 is formed on the first insulating film 12. Then, an element isolating groove is formed, followed by filling the element isolating groove with an insulating film. An element isolating region 15 is formed by planarizing the insulating film until the surface of the floating gate electrode layer 13 is exposed to the outside. Then, an upper portion of the element isolating region 15 in the memory cell array region and the selective gate region is removed so as to allow the upper surface of the element isolating region 15 in the memory cell array region and the selective gate region to be positioned lower than the upper surface of the floating gate electrode 13. Further, a second insulating film 16 is formed on the floating gate electrode layer 13 and the element isolating region 15, followed by removing the second insulating film 16 in the peripheral circuit region and the selective gate region. In the nest step, a control gate electrode layer 18 is formed on the second insulating film 16, the floating gate electrode layer 13 and the element isolating region 15, followed by patterning the control gate electrode layer 18, the second insulating film 16 and the floating gate electrode layer 13. After the patterning step, a third insulating film 19 is formed on the entire surface of the semiconductor layer 11, followed by forming a contact hold 20 in the third insulating film 19. In the nest step, a wiring 21 connected to the contact hole 20 is formed.

In the semiconductor device according to the second prior art described above, it is unnecessary to ensure an aligning allowance Q in the lithography, which is required in the first prior art, so as to make it possible to miniaturize the memory cell. Also, since the control gate electrode layer 18 is deposited after removal of the selective gate region and the second insulating film 16 of the peripheral circuit region, the limitation in the position of the contact hole 20 can be eliminated even if the circuit is separated such that the floating gate is left unremoved in only the element region 10. However, the second prior art gives rise to the problem as described below.

First, the second insulating film 16 is interposed between the floating gate electrode 13 and the control gate electrode layer 18 in the gate in the memory cell array region. However, the second insulating film 16 is not interposed between the floating gate electrode 13 and the control gate electrode layer 18 in the gate in the peripheral circuit region and the selective gate region. In other words, the memory cell array region, the peripheral circuit region and the selective gate region differ from each other in the laminate structure of the gate. As a result, in forming the gate, it is necessary for the memory cell array region, the peripheral circuit region and the selective gate region to be different from each other in the etching conditions, giving rise to the problem that it is impossible to form simultaneously the gates in the memory cell array region, peripheral circuit region and the selective gate region.

It should also be noted that, if it is impossible to form simultaneously the gates in the memory cell array region, the peripheral circuit region and the selective gate region, the electrode layer is left unremoved in the boundary portion between the memory cell array region, the peripheral circuit region and the selective gate region. Also, it is necessary to ensure a sufficient allowance region in order to prevent the semiconductor layer from being dug by the etching treatment performed twice. In order to process accurately both the memory cell array region, the peripheral circuit region and the selective gate region differing from each other in the laminate structure, it is necessary to ensure various allowances in the boundary portion, leading to an increase in the chip area. Particularly, in the construction of the NAND type flash memory, it is necessary to diminish the distance D between the memory cell and the selective transistor as much as possible in order to increase the degree of integration of the memory cell array, as shown in FIG. 48A. What should be noted is that, if an allowance is provided in the boundary portion, the degree of integration is markedly lowered.

As described above it was very difficult to avoid the resistance delay in the peripheral circuit region and the selective gate region while miniaturizing the memory cell array region and to form simultaneously the gates in the memory cell array region, the peripheral circuit region and the selective gate region in the semiconductor device according to each of the first and second prior arts.

BRIEF SUMMARY OF THE INVENTION

According to a first aspect of the present invention, there is provided a semiconductor device, comprising a semiconductor layer; a first insulating film formed on the semiconductor layer; a first electrode layer formed on the first insulating layer; an element isolating region comprising an element isolating insulating film formed to extend through the first electrode layer and the first insulating film to reach an inner region of the semiconductor layer, the element isolating region isolating an element region and being self-aligned with the first electrode layer; a second insulating film formed on the first electrode layer and the element isolating region, an open portion exposing a surface of the first electrode layer being formed in the second insulating film; and a second electrode layer formed on the second insulating film and the exposed surface of the first electrode layer, the second electrode layer being electrically connected to the first electrode layer via the open portion.

According to a second aspect of the present invention, there is provided a semiconductor device, comprising a semiconductor layer; a first insulating film formed on the semiconductor layer; a first electrode layer firmed on the first insulating layer; an element isolating region comprising an element isolating insulating film formed to extend through the first electrode layer and the first insulating film to reach an inner region of the semiconductor layer, the element isolating region isolating an element region and being self-aligned with the first electrode layer; a second insulating film formed on the first electrode layer and the element isolating region, an open portion exposing a surface of the first electrode layer being formed in the second insulating film; a second electrode layer formed on the second insulating film; and a third electrode layer formed on the second electrode layer and the exposed surface of the first electrode layer, the third electrode layer being electrically connected to the first electrode layer via the open portion.

According to a third aspect of the present invention, there is provided a method of manufacturing a semiconductor device in a selective gate region provided a selective gate transistor formed adjacent to a memory cell array region, comprising: forming a first insulating film on a semiconductor layer; forming a first electrode layer on the first insulating film; forming an element isolating region comprising an element isolating insulating film extending through the first electrode layer and the first insulating film to reach an inner region of the semiconductor layer, the element isolating region isolating an element region; forming a second insulating film on the element isolating region and the first electrode layer; forming an open portion within the second insulating film to expose a surface of the first electrode layer; forming a second electrode layer on the second insulating film and the exposed surface of the first electrode layer; and selectively removing the first electrode layer, the second insulating film and the second electrode layer to form a gate electrode.

According to a fourth aspect of the present invention, there is provided a method of manufacturing a semiconductor device in a selective gate region provided a selective gate transistor formed adjacent to a memory cell array region, comprising: forming a first insulating film on a semiconductor layer; forming a first electrode layer on the first insulating film; forming an element isolating region comprising an element isolating insulating film extending through the first electrode layer and the first insulating film to reach an inner region of the semiconductor layer, the element isolating region isolating an element region; forming a second insulating film on the element isolating region and the first electrode layer; forming a second electrode layer on the second insulating film; forming an open portion within the second insulating film to expose a surface of the first electrode layer; forming a third electrode layer on the second electrode layer and the exposed surface of the first electrode layer; and selectively removing the first electrode layer, the second insulating film, the second electrode layer and the third electrode layer to form a gate electrode.

According to a fifth aspect of the present invention, there is provided a method of manufacturing a semiconductor device in a selective gate region provided a selective gate transistor formed adjacent to a memory cell array region, comprising: forming a first insulating film on a semiconductor layer; forming a first electrode layer on the first insulating film; forming an element isolating region comprising an element isolating insulating film extending through the first electrode layer and the first insulating film to reach an inner region of the semiconductor layer, the element isolating region isolating an element region; forming a second insulating film on the element isolating region and the first electrode layer; forming a second electrode layer on the second insulating film; forming a first mask layer on the second electrode layer; forming a groove comprising a pair of mutually facing side surfaces in the first mask layer, the groove being formed to expose partly a surface of the second electrode layer; forming a side wall comprising a second mask layer on the exposed side surface of the groove; selectively removing the second electrode layer and the second insulating film by using the first and second mask layers to form an open portion exposing a surface of the first electrode layer; removing the first and second mask layers; forming a third electrode layer on the second electrode layer and the exposed surface of the first electrode layer; and selectively removing the first electrode layer, the second insulating film, the second electrode layer and the third electrode layer to form a gate electrode.

BRIEF DESCRIPTION OF THE SEVERAL VIEWS OF THE DRAWING

FIG. 30A is a cross sectional view showing a semiconductor device according to the prior art;

FIG. 30B is a cross sectional view showing the semiconductor device according to the sixth embodiment of the present invention;

DETAILED DESCRIPTION OF THE INVENTION

Figure 1:
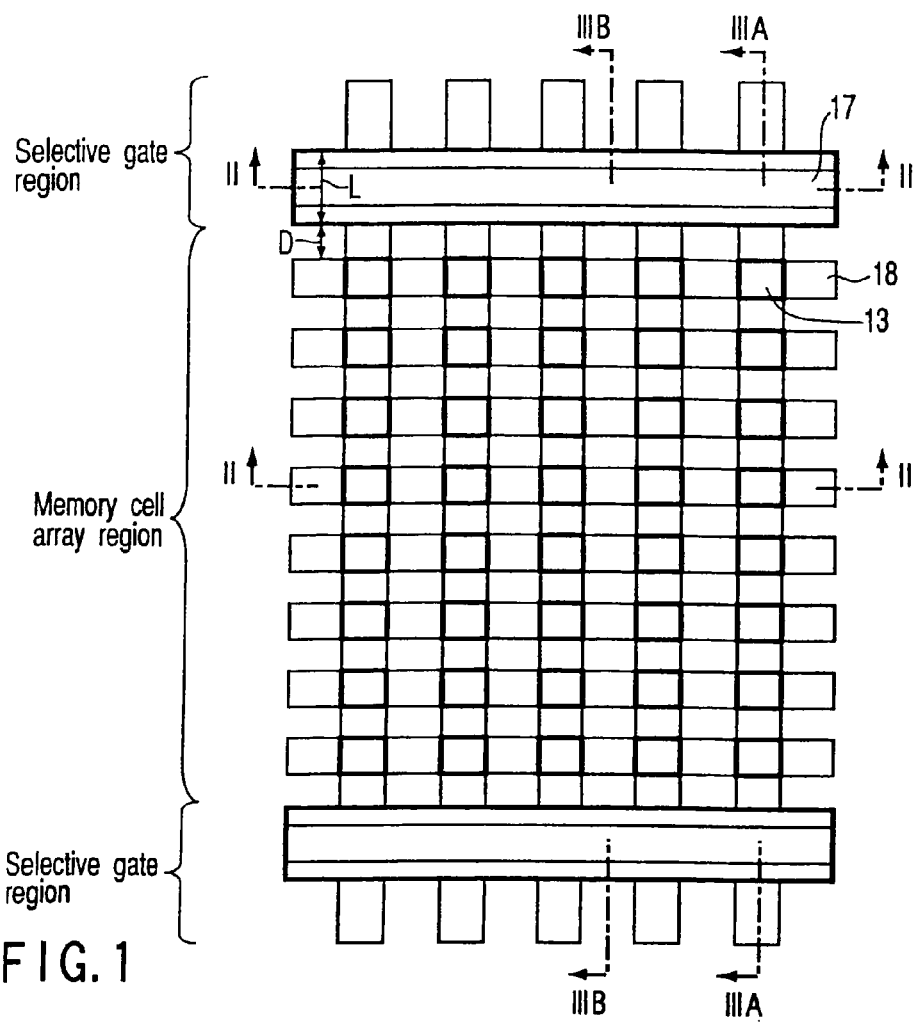
FIG. 1 is a plan view showing the memory cell array region and the selective gate region of a semiconductor device according to a first embodiment of the present invention.

The present invention is directed to the gate structure of a semiconductor device having a nonvolatile memory transistor including a floating gate, a selective transistor arranged close to the memory cell, and a transistor of a peripheral circuit for driving the memory cell array mounted to the same chip. The present invention is applied to, for example, a NAND type flash memory.

Some embodiments of the present invention will now be described with reference to the accompanying drawings. In the following description, the common portions of the semiconductor device are denoted by the common reference numerals. Incidentally, in the drawings, the memory cell array region denotes the region in which a memory transistor is arranged, the selective gate region denotes the region in which the selective transistor is arranged, and the peripheral circuit region denotes the region in which the peripheral circuit transistor is arranged.

[First Embodiment]

A first embodiment is directed to the constructions of the memory transistor and the selective transistor. In this case, an open portion is formed in a part of the insulating film between the first and second electrodes constituting a selective transistor.

Figure 2:
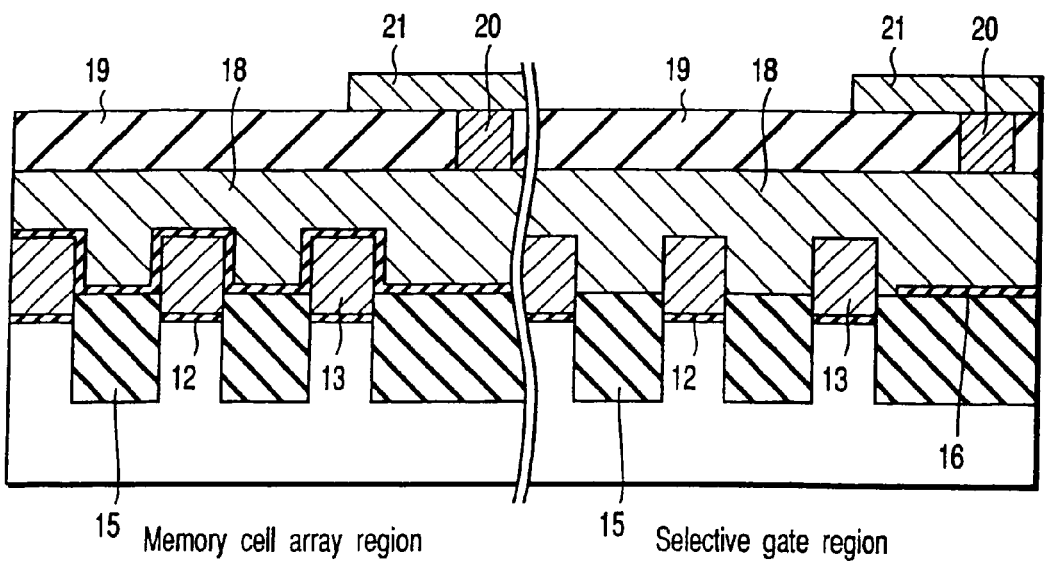
FIG. 2 is a cross sectional view of the semiconductor device along the line shown in FIG. 1.
Figure 3A:
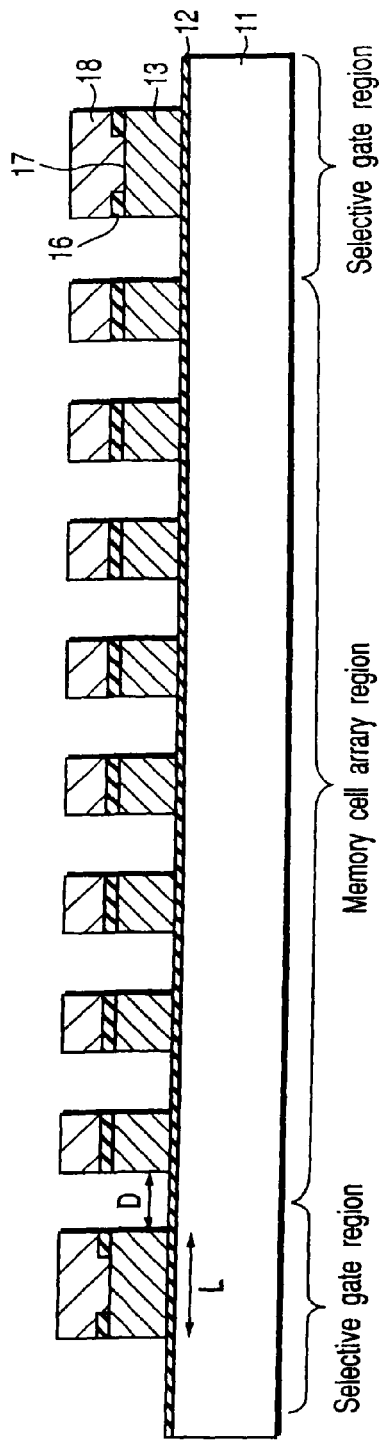
FIG. 3A is a cross sectional view of the semiconductor device along the line IIIA-IIIA shown in FIG. 1.
Figure 3B:
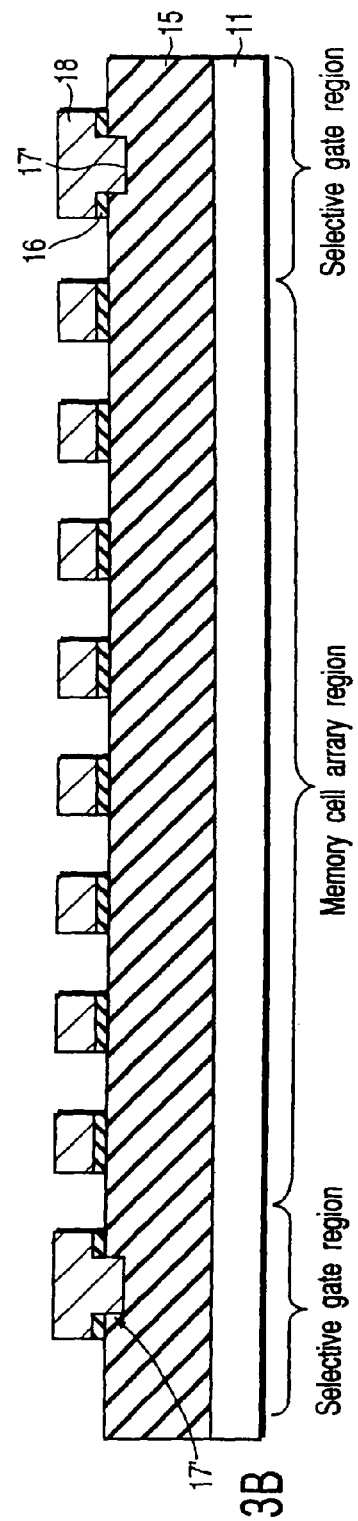
FIG. 3B is a cross sectional view of the semiconductor device along the line shown in FIG. 1.

FIG. 1 is a plan view showing the memory cell array region and the selective gate region of a semiconductor device according to a first embodiment of the present invention. FIG. 2 is a cross sectional view of the semiconductor device along the line II-II shown in FIG. 1. FIG. 3A is a cross sectional view of the semiconductor device along the line IIIA-IIIA shown in FIG. 1. FIG. 3B is a cross sectional view of the semiconductor device along the line IIIB-IIIB shown in FIG. 1.

As shown in FIG. 1, a plurality of memory transistors are connected in series in the memory cell array region, and a selective transistor is arranged close to the memory transistors at both edge portions of the memory cell array region. The selective transistor comprises a first electrode layer, a second electrode layer, and an insulating film formed between the first electrode layer and the second electrode layer. The insulating film is formed in only the edge portions of the first electrode layer and the second electrode layer, and an open portion 17 is formed in the central portion between the first electrode layer and the second electrode layer. The open portion 17 is in the shape of a long stripe crossing the first electrode layer of a plurality of cells and the element isolating region. The gate length L of the selective transistor is longer than the gate length of the memory transistor. Also, the distance D between the memory cell and the selective transistor is about the minimum processing size.

As shown in FIG. 2, the semiconductor device of the memory cell array region comprises the semiconductor layer 11, the element isolating region 15 formed on the semiconductor layer 11 of a trench type for isolating the element region 10, the first electrode layer 13 formed in the element region 10 with the first insulating film 12 interposed therebetween, the second insulating film 16 formed on the first electrode layer 13 and the element isolating region 15, and the second electrode layer 18 formed on the second insulating film 16. Also, the first electrode layer 13 is formed above the element region 10 and self-aligned with the element isolating region 15. The first electrode layer 13 is not pulled up onto the element isolating region 15, such as the first prior art. It should be noted that the surface of the element isolating region 15 is positioned lower than the surface of the first electrode layer 13. In the memory cell array region, the first electrode 13 performs the function of a floating gate, and the second electrode layer 18 performs the function of a control gate.

As shown in FIG. 3A, the semiconductor device in the selective gate region comprises a first electrode layer 13 formed in the element region 10 with the first insulating film 12 interposed therebetween, a second insulating film 16 formed on the first electrode layer 13 and the element separating region 15, and a second electrode layer 18 formed on the second insulating film 16. In the selective transistor of the particular construction, an open portion 17 is formed partially in the second insulating film 16 so as to permit the second electrode layer to be electrically connected to the first electrode layer via the open portion 17.

Incidentally, the pattern of the open portion 17 extends over the element separating region 15 in the selective gate region as shown in FIG. 3B, with the result that the bottom surface of the groove 17' is positioned higher than the element region 10.

It should be noted that the second electrode layer 18 has a resistivity lower than that of the first electrode layer 13. Therefore, it is desirable for the second electrode layer 18 to be formed of, for example, a metal layer having a high melting point or a lamination layer film comprising a metal silicide layer having a high melting point and a polysilicon layer. Also, it is desirable for the second insulating film 16 to be formed of a composite insulating film comprising a silicon nitride film such as an ONO (Oxide Nitride Oxide) film. The silicon nitride film effectively prevents the etching damage in the formation of the contact hole 20 and also prevents effectively the layer for the metal wiring formed within the contact hole from adversely affecting the gate insulating film 12.

Figure 4:
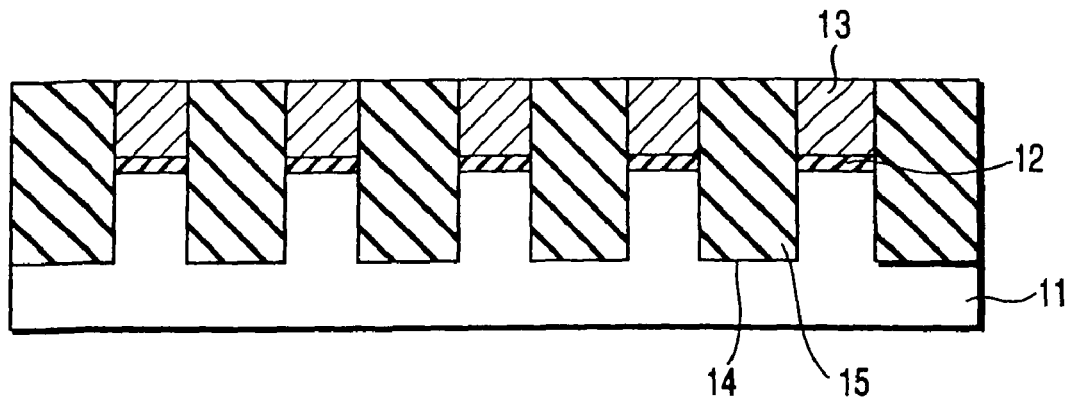
FIGS. 4, 5, 6, 7, 8 and 9 are cross sectional views collectively showing the manufacturing process of the semiconductor device according to the first embodiment of the present invention.
Figure 5:
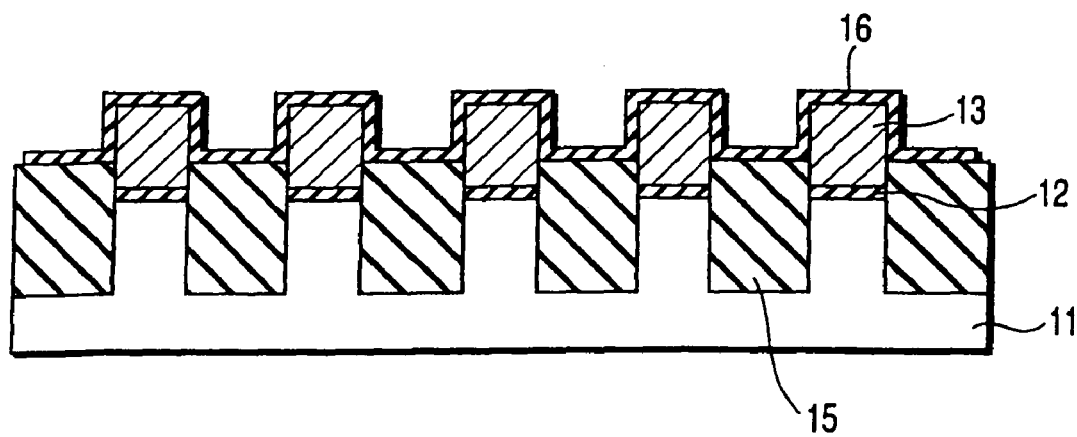

FIGS. 4, 5, 6, 7, 8 and 9 are cross sectional views collectively showing the manufacturing process of the semiconductor device according to the first embodiment of the present invention. FIGS. 4 and 5 are cross sectional views of the semiconductor device along the line II-II shown in FIG. 1, FIGS. 6-9 are cross sectional views of the semiconductor device along the line IIIA-IIIA shown in FIG. 1. Described in the following is the method of manufacturing the semiconductor device according to the first embodiment of the present invention.

First of all, as shown in FIG. 4, the first insulating film 12 is formed on the semiconductor layer 11. The first insulating film 12 performs the function of a tunneling Oxide film and has a thickness of, for example, 8 to 10 nm. In the next step, the first electrode layer 13, for example, a polysilicon film of doping phosphorus, is formed on the first insulating film 12. Then, an element isolating groove 14 is formed, followed by filling the element isolating groove 14 with an insulating film. Further, the insulating film filling the element isolating groove 14 is planarized until the surface of the first electrode layer 13 is exposed to the outside so as to form the element isolating region 15 of STI (Shallow Trench Isolation) structure.

In the next step, as shown in FIG. 5, an upper portion of the element isolating region 15 in the memory cell region is removed so as to allow the surface of the element isolating region 15 in the memory cell region to be positioned lower than the surface of the first electrode layer 13. Then, the second insulating film 16, e.g., an ONO film, is formed on the entire surface of the semiconductor layer 11.

Figure 6:
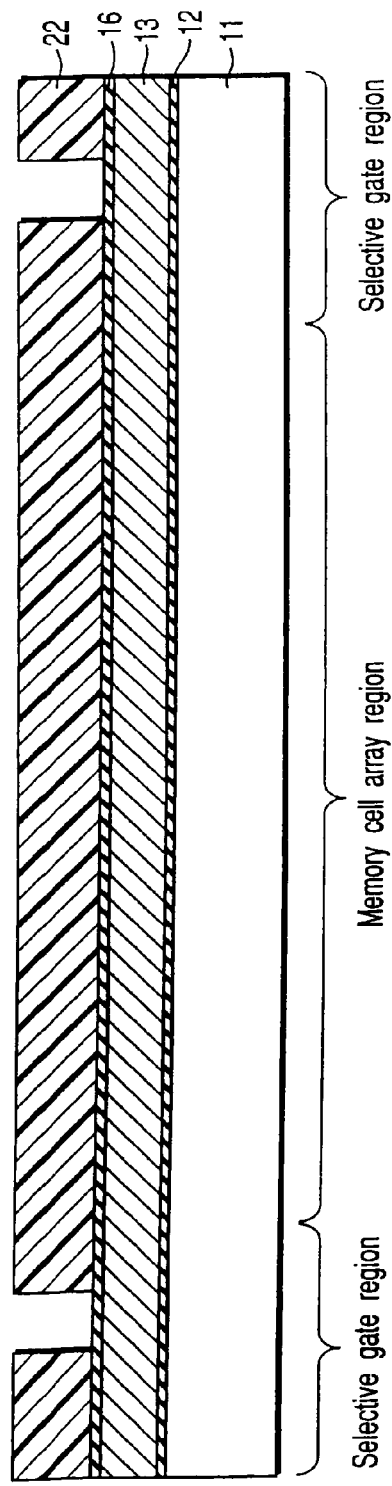

In the next step, as shown in FIG. 6, a mask layer (photoresist) 22 is deposited on the second insulating film 16, followed by patterning the mask layer 22.

Figure 7:
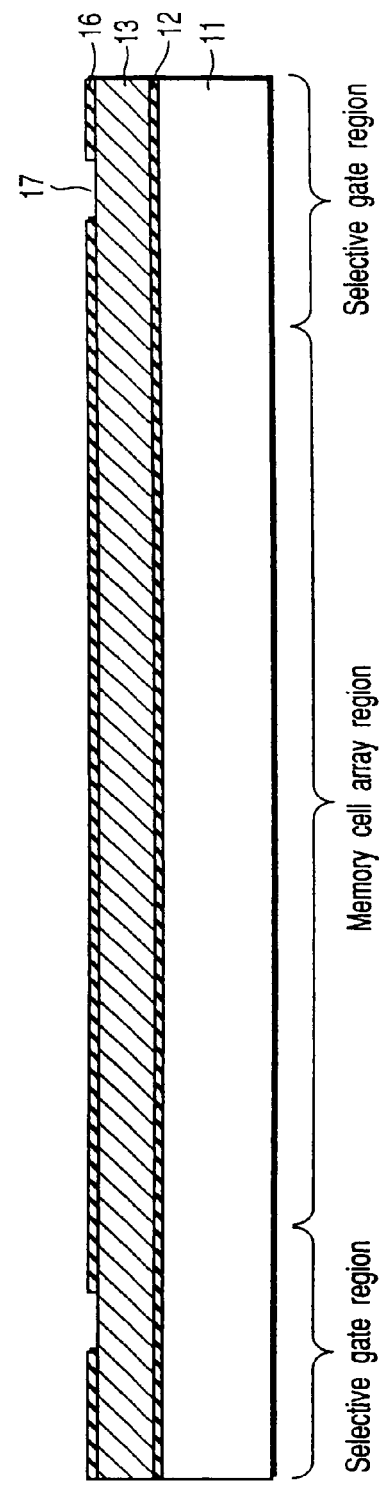

In the next step, as shown in FIG. 7, the second insulating film 16 above the element region 10 in the selective gate region is partly removed by lithography and etching, as a mask of the patterned mask layer 22. As a result, the surface of the first electrode layer 13 is partly exposed to the outside so as to form the open portion 17.

Figure 8:
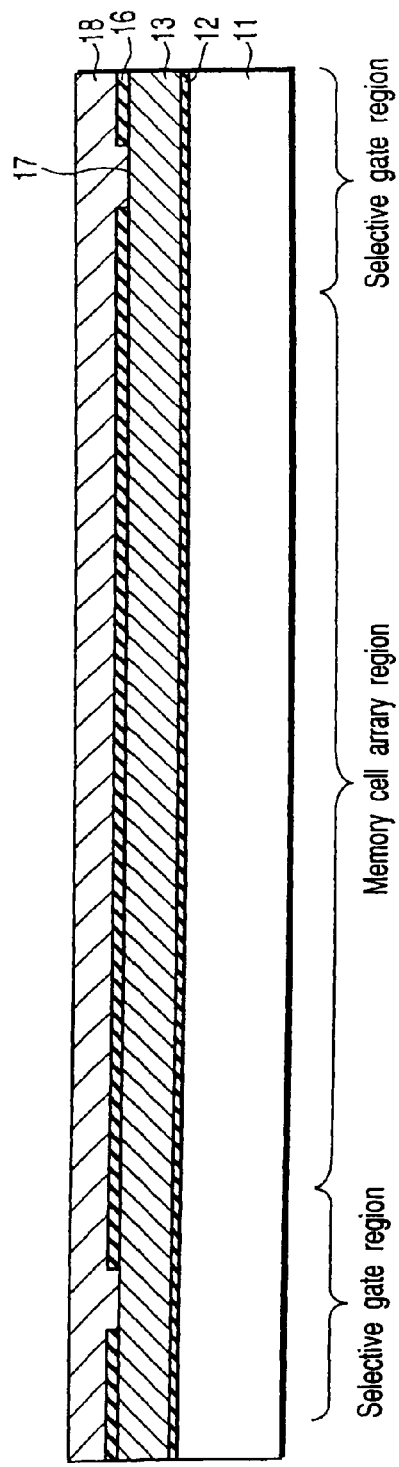

In the next step, as shown in FIG. 8, the second electrode layer 18, e.g., a metal layer having a high melting point or a lamination layer film comprising a metal silicide layer having a high melting point and a polysilicon layer, is formed on the entire surface of the semiconductor layer 11. As a result, the second electrode layer 18 is electrically connected to the first electrode layer 13 in the selective gate region.

Figure 9:
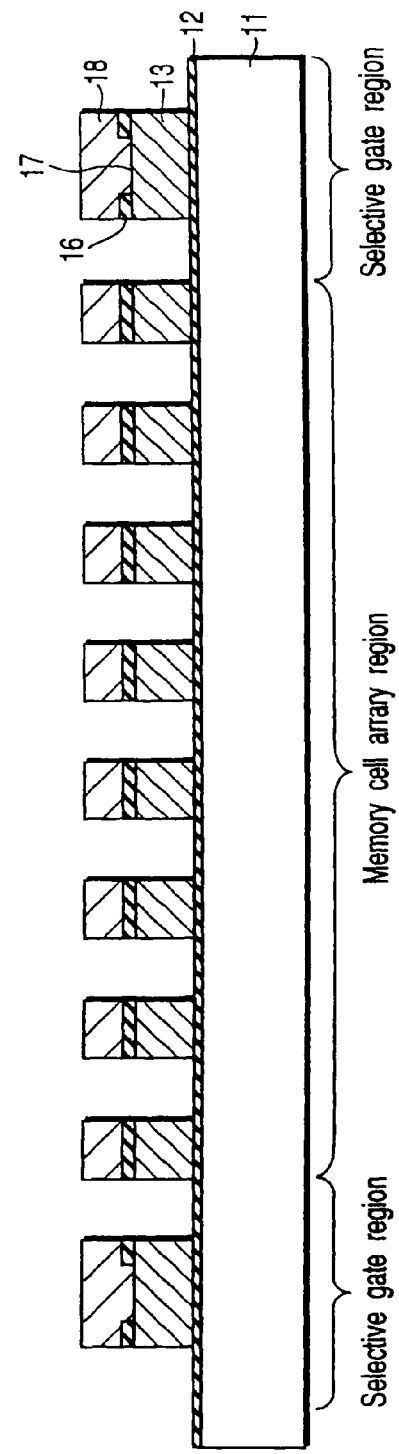

In the next step, as shown in FIG. 9, the second electrode layer 18, the second insulating film 16 and the first electrode layer 13 are formed to the gate pattern. Concretely, first of all, the gate pattern is formed, followed by patterning the second electrode layer 18 as a stopper of the second insulating film 16. Further, the second insulating film 16 is patterned as a stopper of the first electrode layer 13. Finally, the first electrode layer 13 is patterned as a stopper of the first insulating film 12. This process is self-aligned with formation the gate electrode of a two-layer structure in the memory cell region and the selective gate region.

In the next step, as shown in FIG. 2, the third insulating film 19 is formed on the entire surface of the semiconductor layer 11, followed by forming the contact hole 20 in the third insulating film 19, the contact hole 20 being positioned above the element isolating region 15. Also, forming of the contact hole 20 in the memory cell region, the contact hole is formed above the element region formed source and drain region of the peripheral transistor. Further, the wiring 21 connected to the contact hole 20 is formed.

According to the first embodiment described above, the first electrode layer 13 is self-aligned with formation of the element isolating region 15, with the result that the fine processing of the first electrode layer 13 can be performed easily, compared with the 20 first prior art referred to previously It follows that it is possible to miniaturize the memory cell array region.

Also, in the selective gate region, the electrical connection between the wiring 21 for supplying signals to the first electrode layer 13 and the first electrode layer 13 is achieved via the second electrode layer 18 extended over the element isolating region 15. In other words, it is unnecessary to draw the first electrode layer 13 having a high resistively onto the element isolating region 15, making it possible to avoid the problem of the delay caused by the resistance of the first electrode layer 13 and to avoid the problem of the RC delay caused by the capacitive coupling between the semiconductor layer 11 and the first electrode layer 13. In addition, since the second electrode layer 18 is formed of a metal layer having a high melting point or a low resistance layer including a metal silicide layer having a high melting point, it is possible to avoid the problem of the resistance delay, making it possible to obtain an operating speed substantially equal to that of the transistor formed of a gate electrode layer of a single layer structure having a low resistivity. It follows that it is possible to avoid the problem that the reading speed of the memory cell is adversely affected by the increase in the delay time.

Concerning the gate of the selective gate region, the open portion 18 is formed in the center of the second electrode layer 18. Therefore, the gate is of a two-layer structure consisting of the first electrode layer 13 and the second electrode layer 18. However, the gate is of a three-layer structure, consisting of the first electrode layer 13, the second electrode layer 18, and the second insulating film 16 interposed between the first electrode layer 13 and the second electrode layer 18 in the edge portion of the second electrode layer 18 in which the gate is formed. It follows that, concerning the region in which the gate is formed, the memory cell array region and the selective gate region are equal to each other in the laminate structure of the gate. As a result, it is possible to form simultaneously the gates in the memory cell array region and the selective gate region. In addition, since a special structure is not required between the selective gate region and the memory cell array region, it is possible to set the distance D between the memory cell and the selective transistor at, for example, the minimum processing size.

Also, in the open portion 17 of the insulating film 16, the length of the open portion 17 in a direction perpendicular to the direction of the gate length L is large, though the width of the open portion 17 in the direction of the gate length L is small. As a result, the resolution is facilitated in the lithography process in patterning the open portion 10. It follows that it is possible to form a fine open portion 17 even in the case where the gate length L of the selective transistor is rendered long in accordance with miniaturization of the selective transistor.

As described above, the first embodiment of the present invention makes it possible to decrease the memory cell size and to improve the degree of integration including the selective transistor. Particularly, it is possible to decrease the size of the memory cell array of the NAND type flash memory.

[Second Embodiment]

A second embodiment is featured in that the control gate is formed of a plurality of electrode layers in order to prevent the deterioration in the reliability of the second insulating film in the memory cell array region in forming an open portion.

Figure 10:
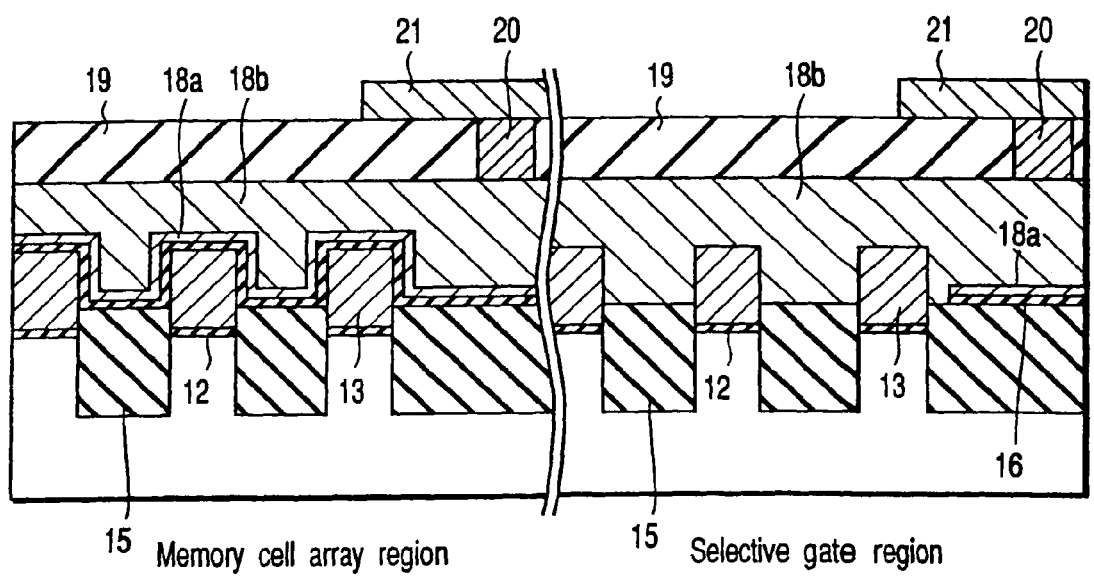
FIG. 10 is a cross sectional view showing the memory cell array region and the selective gate region of the semiconductor device according to a second embodiment of the present invention.

FIG. 10 is a cross sectional view showing the memory cell array region and the selective gate region of the semiconductor device according to a second embodiment of the present invention. FIG. 10 is a cross sectional view of the semiconductor device along the line II-II shown in FIG. 1. As shown in FIG. 10, the semiconductor device according to the second embodiment of the present invention comprises a control gate of a laminate structure consisting of the second and third electrode layers 18a and 18b.

FIGS. 11, 12, 13 and 14 are cross sectional views collectively showing the manufacturing process of the semiconductor device according to the second embodiment of the present invention. FIGS. 11, 12, 13 and 14 are cross sectional views of the semiconductor device along the line IIIA-IIIA shown in FIG. 1. Described in the following is the method of manufacturing the semiconductor device according to the second embodiment of the present invention. A description of process common to the first embodiment will be omitted, and only different process will be described. In the first step, as shown in FIG. 5, the second insulating film 16 is formed on the first electrode layer 13, such as the first embodiment.

Figure 11:
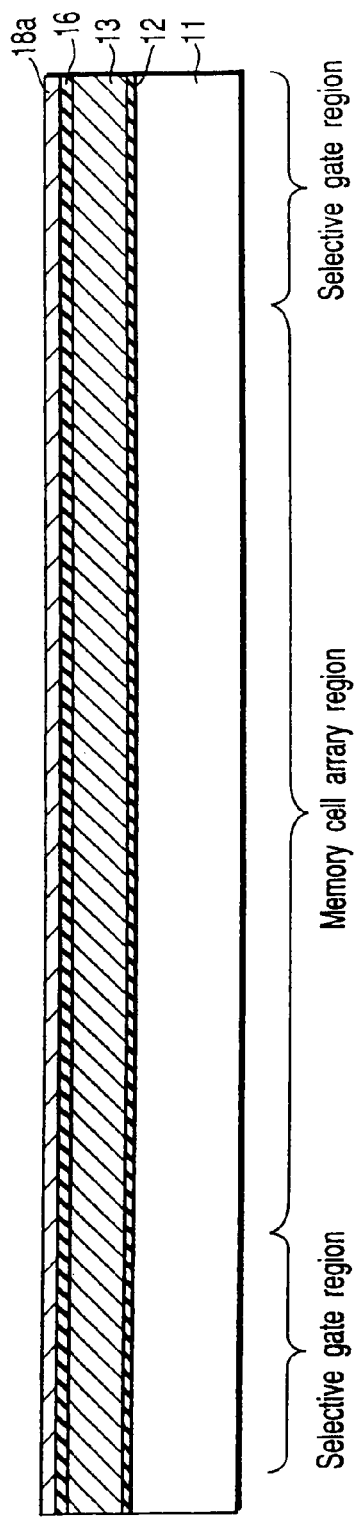
FIGS. 11, 12, 13 and 14 are cross sectional views collectively showing the manufacturing process of the semiconductor device according to the second embodiment of the present invention.

In the next step, as shown in FIG. 11, the second electrode layer 18a is formed on the second insulating film 16, before forming the open portion 17.

Figure 12:
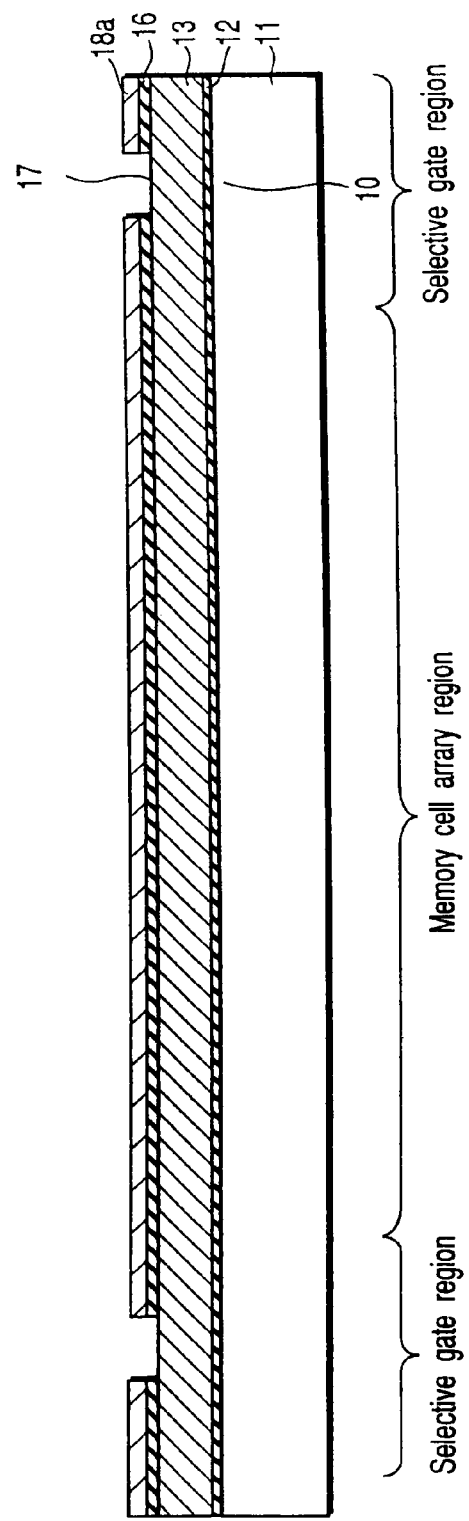

In the next step, as shown in FIG. 12, the second electrode layer 18a and the second insulating film 16 above the element region 10 in the selective gate region is partly removed by lithography and etching. As a result, the surface of the first electrode layer 13 is partly exposed to the outside so as to form the open portion 17.

Figure 13:
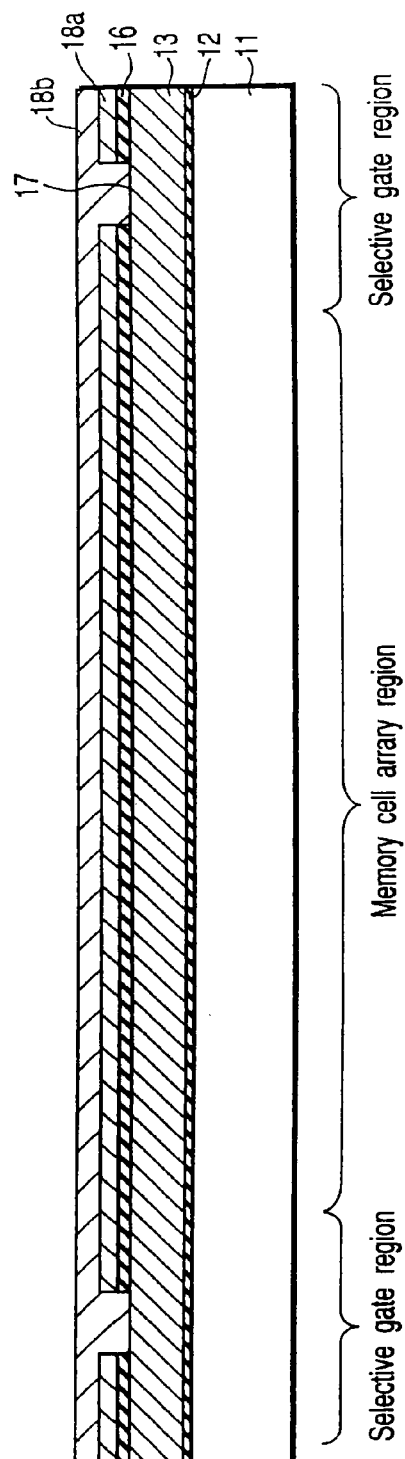

In the next step, as shown in FIG. 13, the third electrode layer 18b is formed on the entire surface of the semiconductor layer 11. As a result, the second electrode layer 18a is electrically connected to the third electrode layer 18b in the selective gate region.

Figure 14:
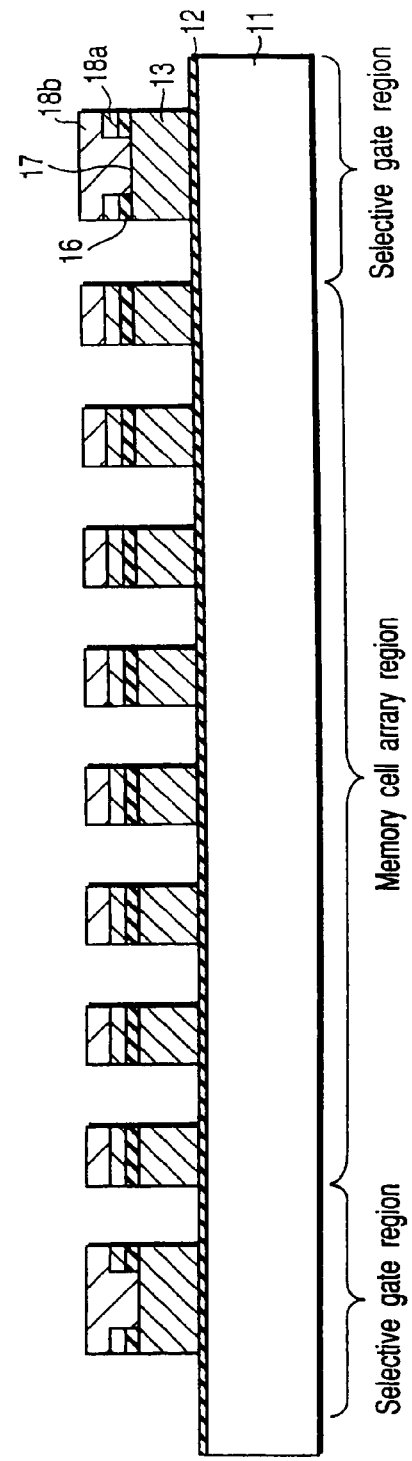

In the next step, as shown in FIG. 14, the third electrode layer 18b, the second electrode layer 18a, the second insulating film 16 and the first electrode layer 13 are formed to the gate pattern. Then, the semiconductor device according to the second embodiment of the present invention is formed by the process similar to that in the first embodiment.

The second embodiment, which produces the effect similar to that obtained in the first embodiment, further produces an additional effect as follows.

In the first embodiment, a resist forming the mask 22 is formed on the second insulating film 16 in the memory cell array region in the lithography process, i.e., the step shown in FIG. 6, for forming the open portion 17. As a result, the resist is brought into contact with the second insulating film 16 in some cases so as to deteriorate the reliability of the second insulating film. For example, the impurity contaminant is migrated from the resist into the second insulating film 16. Also, the insulating properties of the second insulating film are lowered in various stages of the lithography process. Under the circumstances, the second electrode layer 18a is formed in the second embodiment on the second insulating film 16 before formation of the open portion 17. What should be noted is that the second electrode layer 18a performs the function of a protective film in the lithography process so as to eliminate the problem in respect of the adverse effect given to the second insulating film 16.

[Third Embodiment]

A third embodiment is directed to a method that is effective in the case where it is desired to decrease the width of the open portion referred to previously in conjunction with the first embodiment. For example, the miniaturization has proceeded to the stage that the gate length of the selective transistor has been decreased to about 0.2 µm in the NAND type flash memory. If an open portion is to be formed in only the central portion of the gate, it is necessary to form a pattern having a width of, for example, 0.1 µm. The third embodiment is effective for such a case. Incidentally, the semiconductor device according to the third embodiment of the present invention is substantially equal to the semiconductor device according to the second embodiment and, thus, description of semiconductor device according to the third embodiment is omitted.

FIGS. 15, 16, 17 and 18 are cross sectional views collectively showing the manufacturing process of the semiconductor device according to a third embodiment of the present invention. FIGS. 15, 16, 17 and 18 are cross sectional views of the semiconductor device along the line IIIA-IIIA shown in FIG. 1. Described in the following is the method of manufacturing the semiconductor device according to the third embodiment of the present invention. A description of process common to the first and second embodiment will be omitted, and only different process will be described.

In the first step, as shown in FIG. 11, the second electrode layer 18a is formed on the second insulating film 16, such as the second embodiment.

Figure 15:
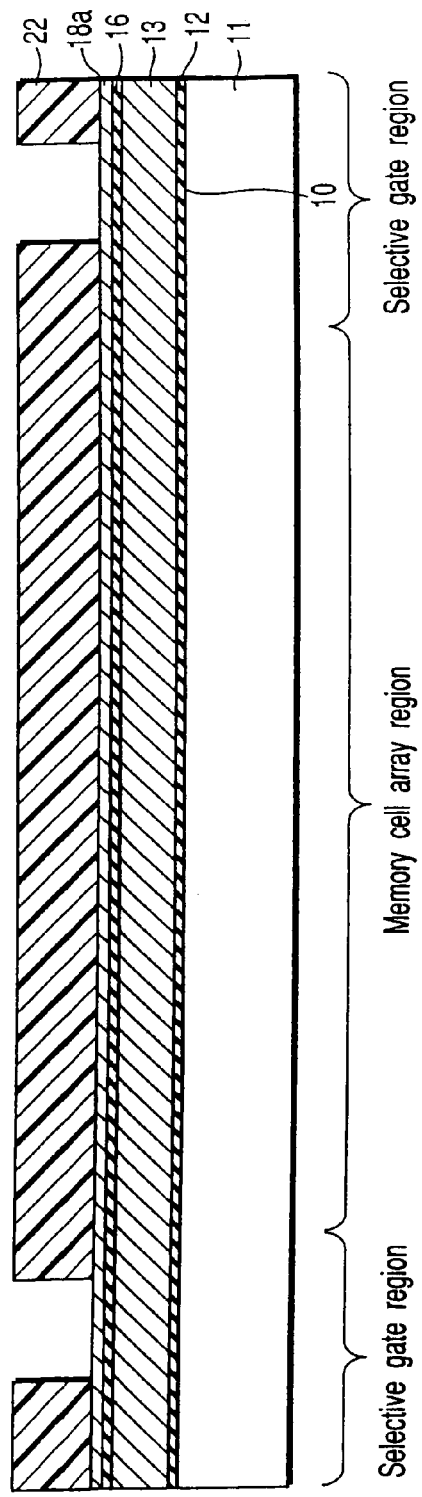
FIGS. 15, 16, 17 and 18 are cross sectional views collectively showing the manufacturing process of the semiconductor device according to a third embodiment of the present invention.

In the next step, as shown in FIG. 15, a first mask layer (oxide film) 22 is deposited on the second electrode layer 18a by a CVD (Chemical Vapor Deposition) method, followed by patterning the first mask layer 22 by lithography so as to form a groove exposing partly the surface of the second electrode layer 18a above the element region 10.

Figure 16:
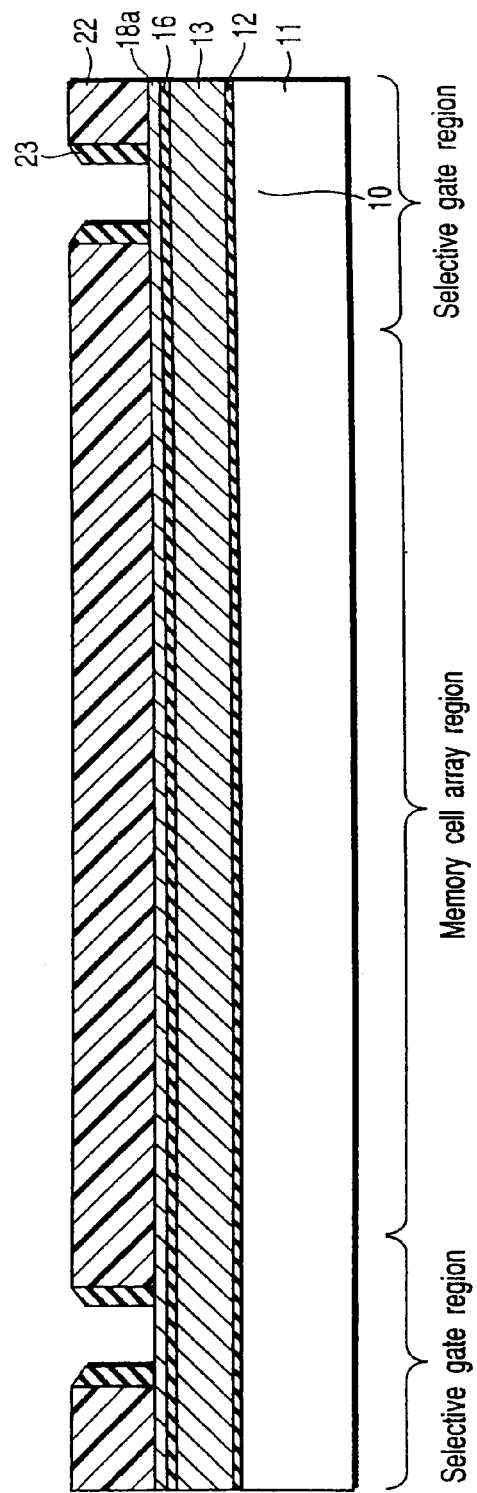

Then, as shown in FIG. 16, a second mask layer 23 (oxide film) is deposited on the first mask layer 22 and the second electrode layer 18a, followed by selectively removing by etch back the second mask layer 23 from the first mask layer 22 and the second electrode layer 18a. As a result, side walls each consisting of the remaining second mask layer 23 are formed on the side surfaces of the groove.

Figure 17:
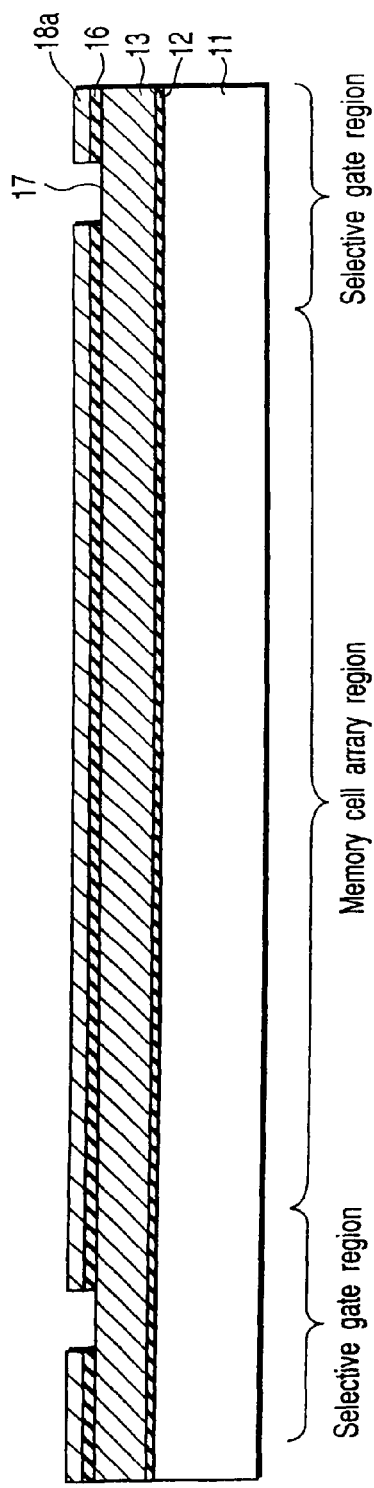

In the next step, the electrode layer 18a and the second insulating film 16 are selectively removed by using the first and second mask layers 22, 23 as a mask so as to form the open portion 17 above the element region 10, as shown in FIG. 17. Then, the first and second mask layers 22 and 23 are removed.

Figure 18:
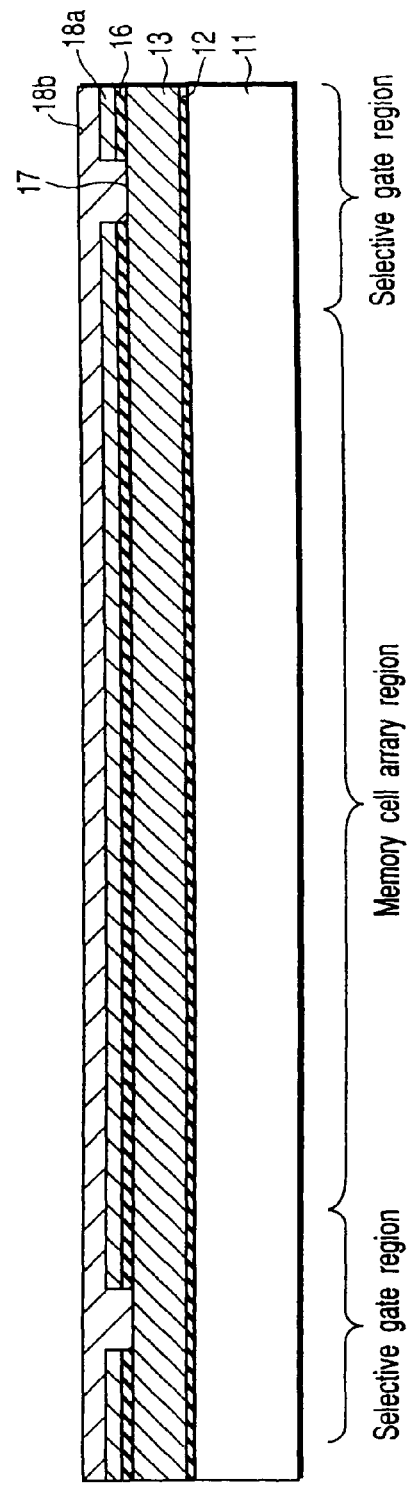

Further, the third electrode layer 18b is formed on the second electrode layer 18a and the first electrode layer 13, as shown in FIG. 18 so as to allow the first electrode layer 13 to be connected to the third electrode layer 18b.

The third embodiment permits producing the effects similar to those obtained in the first and second embodiments.

It should also be noted that the second electrode layer 18a constituting a part of the control gate and the second insulating film 16 are self-aligned with the open portion 17. As a result, it is possible to form the open portion 17 with a width smaller than the size that can be achieved by the lithography, making it possible to achieve the connection between the first electrode layer 13 and the third electrode layer 18b with a space smaller than that in the first embodiment. It follows that It is possible to further miniaturize a gate length of the selective transistor, compared with the first embodiment.

As described above, the third embodiment is highly effective in the cases where the gate length of the selective transistor is small so as to make it impossible to form the open portion in the center of the gate with a size.

Incidentally, the method utilizing formation of the side wall described above permits forming the open portion 17 with a width smaller than that in the case of using the lithography. Alternatively, it is also possible to employ the method of, for example, swelling the photoresist by the heat treatment after the lithography process so as to form the open portion of a smaller space. As a result, it is possible to form the open portion having the width smaller than the width of the groove formed by the lithography process.

[Fourth Embodiment]

In each of the first to third embodiments of the present invention, the technical idea of the present invention is applied to the memory cell array region and the selective gate region. On the other hand, a fourth embodiment of the present invention is featured in that the structure similar to that of the selective gate region is also applied to the peripheral circuit region.

Figure 19:
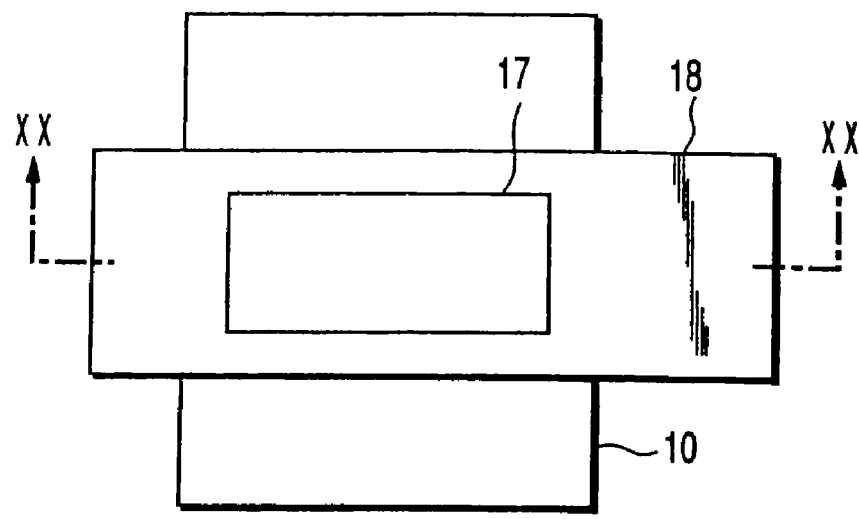
FIG. 19 is a plan view showing the peripheral circuit region of a semiconductor device according to a fourth embodiment of the present invention.
Figure 20:
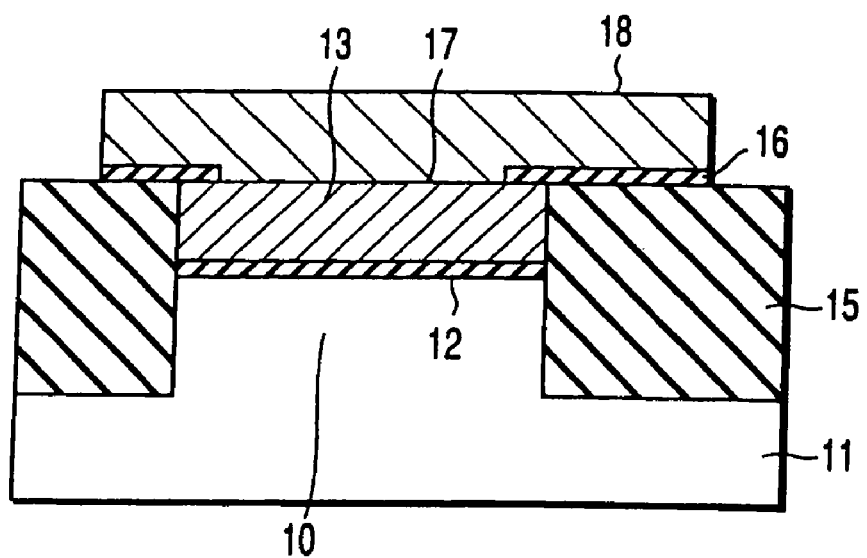
FIG. 20 is cross sectional view of the semiconductor device along the line XX-XX shown in FIG. 19.

FIG. 19 is a plan view showing the peripheral circuit region of a semiconductor device according to a fourth embodiment of the present invention. FIG. 20 is cross sectional view of the semiconductor device along the line XX-XX shown in FIG. 19.

As shown in FIGS. 19 and 20, the semiconductor device in the peripheral circuit region comprises a semiconductor substrate 11, an element isolating region 15 for isolating an element region 10 of the semiconductor layer 11, a first electrode layer 13 formed on the element isolating region 10 with the first insulating film 12 interposed therebetween and self-aligned with the element isolating region 15, a second insulating film 16 having an open portion 17 partly exposing the surface of the first electrode layer 13 to the outside, and a second electrode layer 18 formed on the second insulating film 16 and within the open portion 17. The first electrode 13 is connected to the second electrode layer 18 via the open portion 17.

Figure 21:
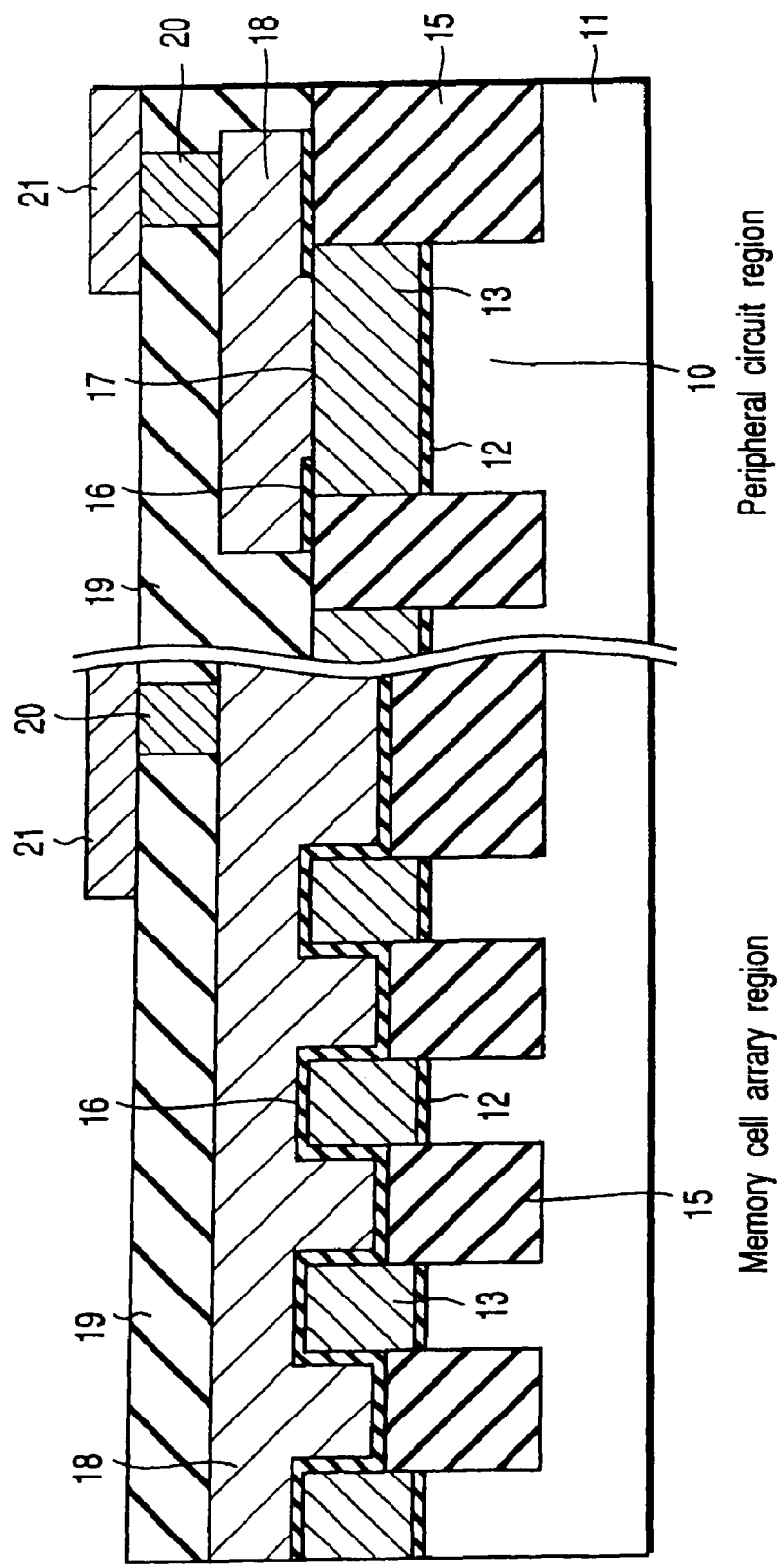
FIG. 21 is a cross sectional view showing the peripheral circuit region and the memory cell array region of the semiconductor device according to the fourth embodiment of the present invention.

FIG. 21 is a plan view showing the peripheral circuit region and the memory cell array region of the semiconductor device according to the fourth embodiment of the present invention. As apparent from FIG. 21, the construction of the memory cell array region and the selective gate region is equal to that in the first embodiment. Therefore, the description is omitted in respect of the constructions of the memory cell array region and the selective gate region.

As shown in FIG. 21, the contact hole 20 in the fourth embodiment is connected to the second electrode layer 18 above the element isolating region 15. Also, the electrical connection between the first electrode layer 13 and a wiring 21 for supplying signals to the first electrode layer 13 is achieved via the second electrode layer 18 extending over the element isolating region 15.

The fourth embodiment, which produces the effect similar to that obtained in the first embodiment, further produces an additional effect as follows.

First of all, in the fourth embodiment of the present invention, the first electrode layer 13 having a low resistivity is connected to the second electrode layer 18 having a low resistivity right above the element region 10. As a result, it is possible to shorten the RC delay time of the peripheral circuit, compared with the prior art, as in the selective transistor.

Also, the open portion 17 is not present in the edge portions of the first electrode layer and the second electrode layer above the element region 10. Therefore, in the process step of the gate, it is possible to process simultaneously the peripheral circuit region in addition to the memory cell array region and the selective gate region. Where the gates of all the elements can be processed simultaneously, the aligning allowance in the lithography process requiring the contact hole and the gate electrode can be decreased in the subsequent step of forming the contact hole.

[Fifth Embodiment]

A fifth embodiment is a modification of the fourth embodiment and is featured in that the second insulating film in the peripheral circuit region is removed completely.

Figure 22:
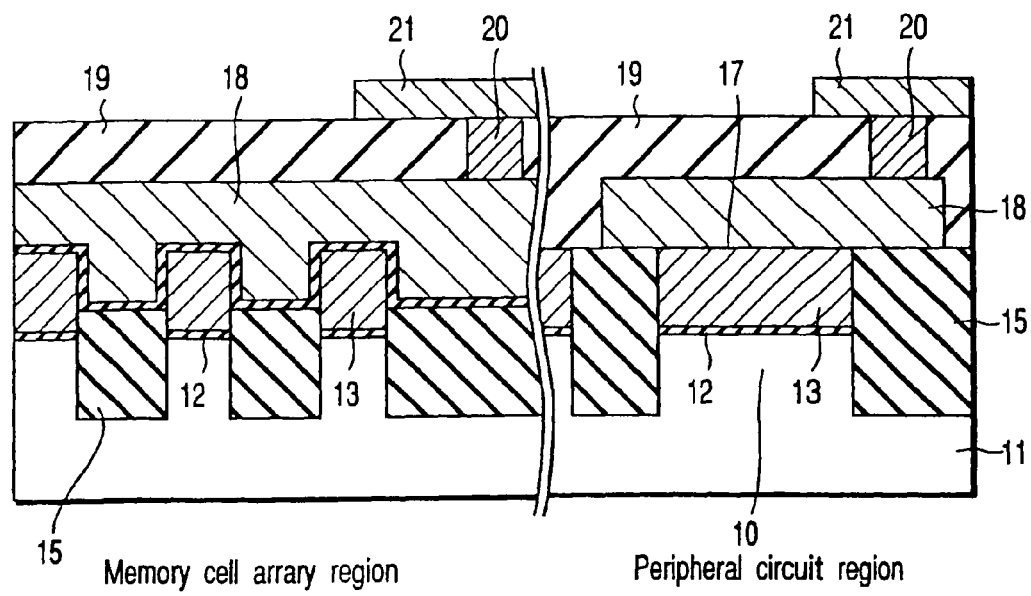
FIG. 22 is a cross sectional view showing the peripheral circuit region and the memory cell array region of a semiconductor device according to a fifth embodiment of the present invention.

FIG. 22 is a cross sectional view showing the memory cell array region and the peripheral circuit region of a semiconductor device according to the fifth embodiment of the present invention. Only that construction of the fifth embodiment which differs from that of the fourth embodiment will now be described.

Depending on the performance and the operating voltage required for the peripheral circuit, the gate of the transistor constituting the peripheral circuit must be made very short in some cases. In this case, it is necessary to make small the open portion 17 of the second insulating film 17. However, if the size of the opening is very small, it is very difficult to form the open portion 17 if using the third embodiment.

Such being the situation, the second insulating film 16 is completely removed in the transistor of the peripheral circuit region, as shown in FIG. 22. The memory cell region and the selective gate region are same structure the first embodiment.

In other words, the peripheral circuit region of the semiconductor device according to the fifth embodiment of the present invention comprises the semiconductor layer 11, the semiconductor isolating region 15 isolating the element region 10 of the semiconductor layer 11, the first electrode layer 13 formed above the element region 10 with the first insulating film 12 interposed therebetween and self-aligned with the element isolating region 15, and the second electrode layer 18 formed on the first electrode layer 13 and the element isolating region 15.

The fifth embodiment of the present invention produces the effects similar to those produced by the fourth embodiment.

Further, the fifth embodiment is effective in the case where the gate length of the transistor is very short. It should be noted, however, that, since the peripheral circuit transistor differs from the memory transistor and the selective transistor in the gate structure, it is necessary to apply the gate processing separately to the memory cell array region, the selective gate region and the peripheral circuit region, leading to an increase in the number of manufacturing steps. However, since the memory transistor and the selective transistor are equal to each other in the construction of the gate edge portion, the memory cell array region and the selective gate region can be processed simultaneously so as to make it unnecessary to provide processing boundary. It follows that the fifth embodiment produces a prominent effect in decreasing the total area of the memory cell array like the other embodiments described previously.

Incidentally, the selective transistor is generally designed somewhat longer than the minimum possible size of the lithography because the selective transistor is required to withstand a high voltage required for driving the memory cell. It follows that it is sufficiently possible to form the fine open portion 17 by, for example, the method described previously in conjunction with the third embodiment of the present invention.

[Sixth Embodiment]

A sixth embodiment is featured in that a contact hole is formed above the element region in which the second insulating film is present so as to decrease the area of the peripheral transistor.

Figure 23:
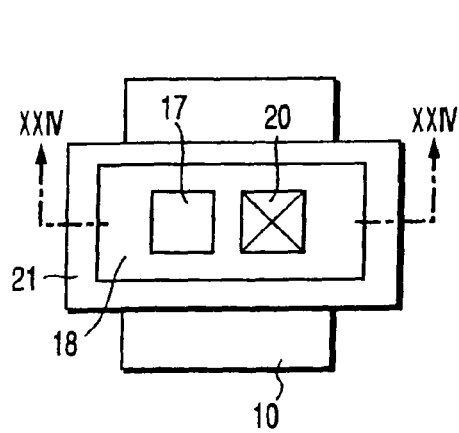
FIG. 23 is a plan view showing the peripheral circuit region of a semiconductor device according to a sixth embodiment of the present invention.
Figure 24:
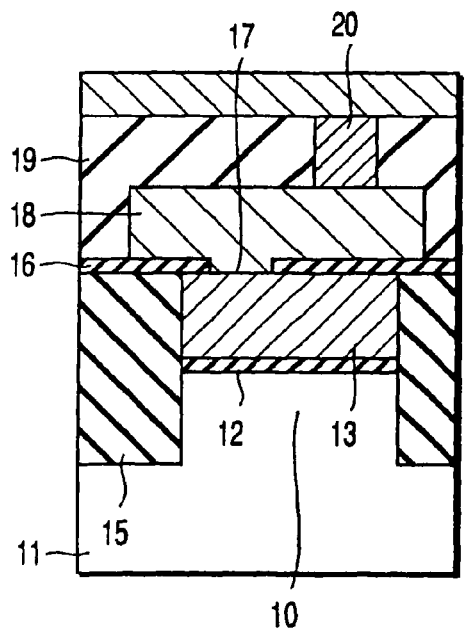
FIG. 24 is a cross sectional view of the semiconductor device along the line XXIV-XXIV shown in FIG. 23.
Figure 25:
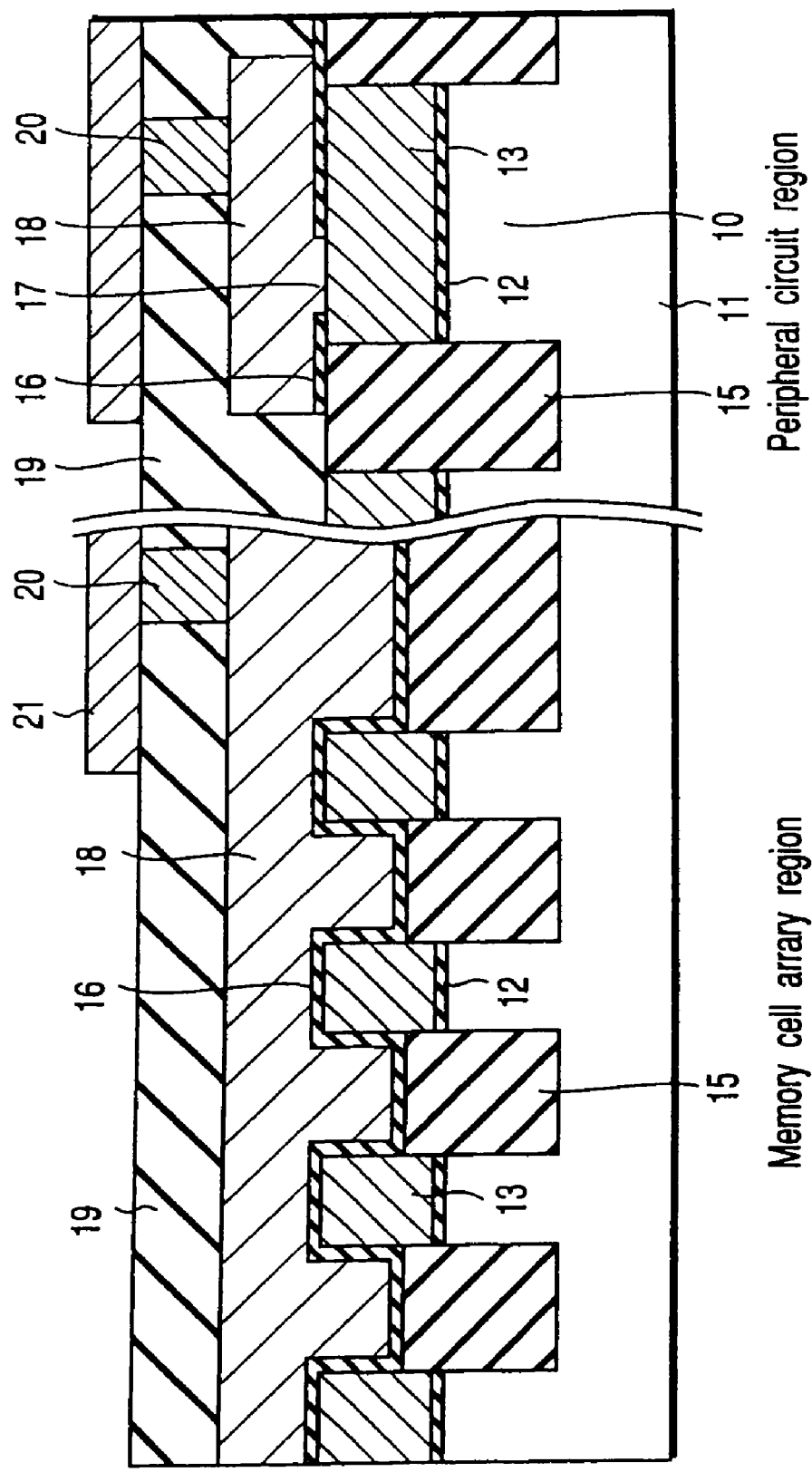
FIG. 25 is a cross sectional view showing the peripheral circuit region and the memory cell array region of the semiconductor device according to the sixth embodiment of the present invention.

FIG. 23 is a plan view showing the peripheral circuit region of a semiconductor device according to a sixth embodiment of the present invention. FIG. 24 is cross sectional view of the semiconductor device along the line XXIV-XXIV shown in FIG. 23. FIG. 25 is a plan view showing the peripheral circuit region and the memory cell array region of the semiconductor device according to the sixth embodiment of the present invention. In the sixth embodiment, the construction of the memory cell array region and the selective gate region is equal to that in the first embodiment. Therefore, the description is omitted in respect of the constructions of the memory cell array region and the selective gate region.

As shown in FIGS. 23, 24 and 25, the semiconductor device In the peripheral circuit region comprises a semiconductor layer 11, an element isolating region 15 for isolating an element region 10 of the semiconductor layer 10, a first electrode layer 13 formed above the element region with a first insulating film 12 interposed therebetween and self-aligned with the element isolating region 15, a second insulating film 16 having an open portion 17 exposing partly the surface of the first electrode layer 13, a second electrode layer 18 formed on the second insulating film 16 and within the open portion 17, and a contact hole 20 formed above the element region 10 and connected to the second electrode layer 18. It should be noted that the first electrode layer 13 and the second electrode layer 18 are connected to each other via the open portion 17.

The sixth embodiment produces effects similar to those produced by the fourth embodiment and additional effects as described below.

In general a barrier metal film (Ti/TiN), an Al—Cu film, etc. are formed in the contact hole 20 by a sputtering method for connection of the contact hole 20 to the gate. What should be noted is that Ti in the barrier metal film reacts with polysilicon forming the second electrode layer 18 so as to form a TiSi layer. Therefore, where the second insulating film 16 is not formed, the TiSi layer is formed to extend from the interface between the contact hole 20 and the second electrode layer 18 to reach a region near the first insulating film 12, making it possible to destroy the first insulating film 12. Such being the situation, the contact hole 20 connected to the gate is not formed in general above the element region 10.

In the sixth embodiment, however, the second insulating film 16 is interposed between the first electrode layer 13 and the second electrode layer 18. What should be noted is that the second insulating film 16 thus formed acts as a protective film so as to avoid the problem described above. Particularly, where a composite film including a silicon nitride film is used as the second insulating film 16, the nitride film is highly effective for avoiding the influences given to the metal of the upper layer having a high melting point and to the underlying polysilicon film of the silicide layer.

As described above, according to the sixth embodiment of the present invention, the second insulating film 16 is left unremoved so as to make it possible to form the contact hole 20 above the element region 10. It follows that it is possible to obtain prominent effects similar to those obtained in each of the first to third embodiments described previously, as described below.

Figure 26A:
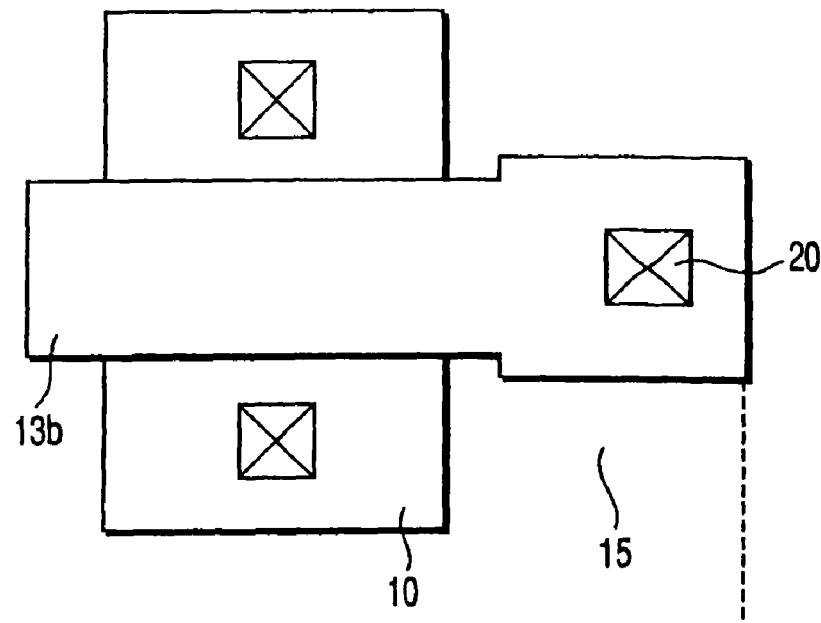
FIG. 26A is a plan view showing a semiconductor device according to the prior art.
Figure 26B:
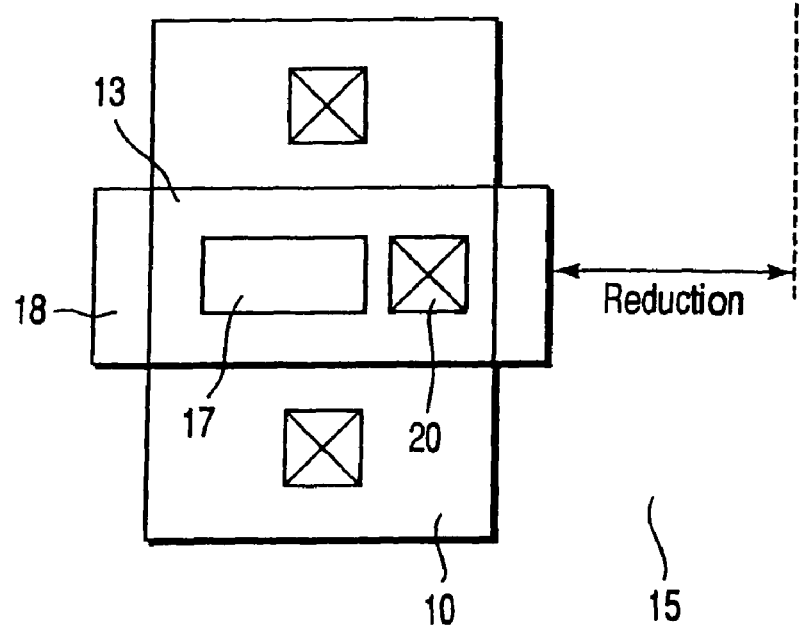
FIG. 26B is a plan view showing the semiconductor device according to the sixth embodiment of the present invention.

First of all, the sixth embodiment of the present invention shown in FIG. 26B, in which the contact hole 20 is formed above the element region 10, permits decreasing the area of the peripheral circuit, compared with the conventional structure shown in FIG. 26A, in which the contact hole 20 is formed above the element separating region.

Figure 27:
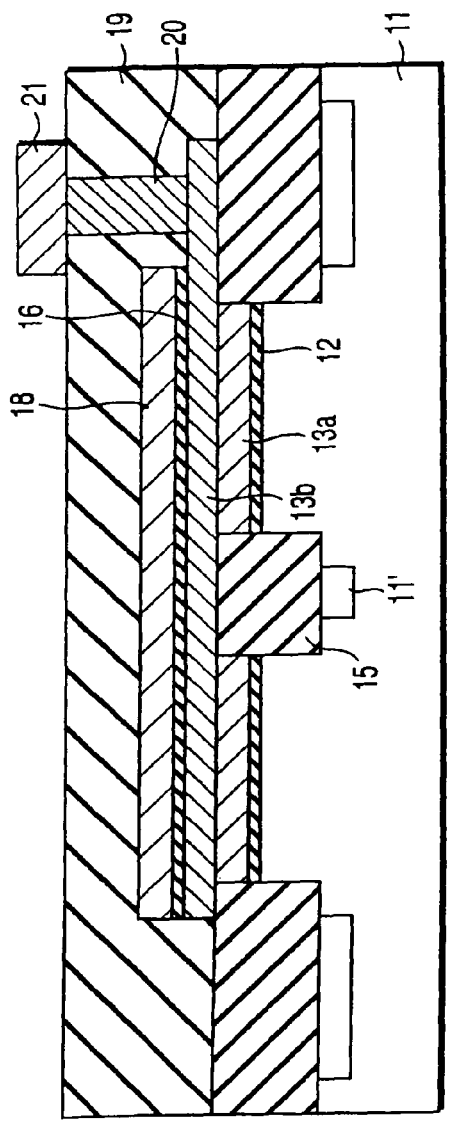
FIGS. 27 and 28 are cross sectional views collectively showing a semiconductor device according to the prior art.
Figure 28:
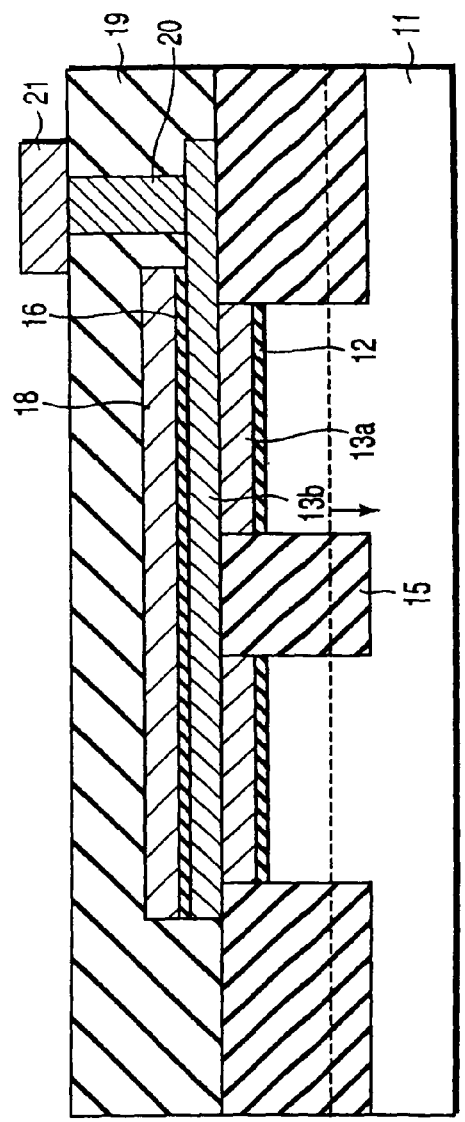
Figures 29A, 29B:
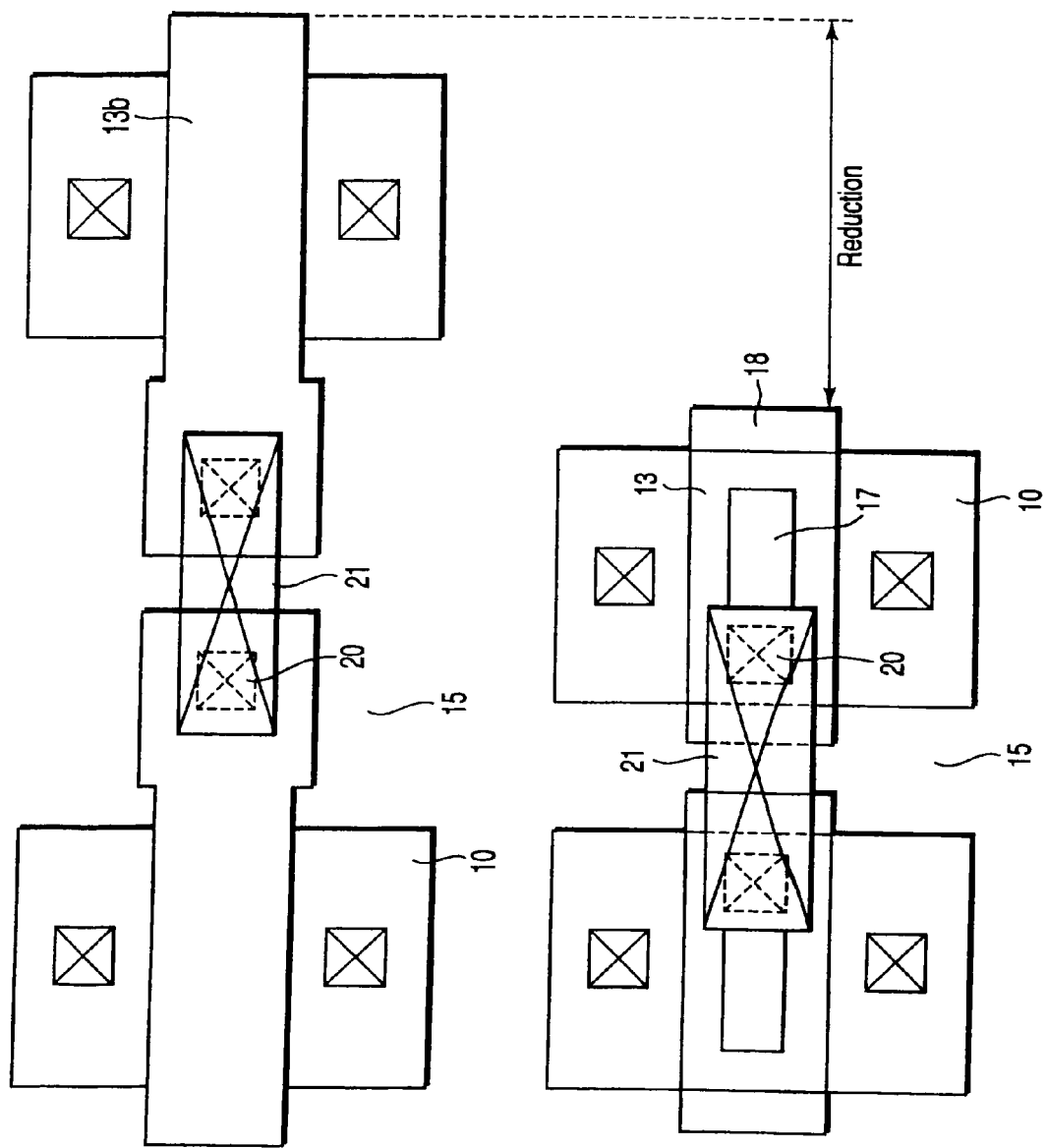
FIG. 29A is a plan view showing a semiconductor device according to the prior art.
FIG. 29B is a plan view showing the semiconductor device according to the sixth embodiment of the present invention.

What should also be noted is that the sixth embodiment of the present invention makes it possible to increase the inversion voltage of the element separating region 15 without increasing the peripheral circuit region. To be more specific, in a semiconductor device using a high voltage such as a NAND type flash memory, it is necessary to increase the inversion voltage of the element separating region 15 below the gate. In this case, it was necessary to take measures. For example, it was necessary to increase the impurity concentration in the impurity diffusion layer 11' of the semiconductor layer 11 below the element separating region 15, as shown in FIG. 27. Alternatively, it was necessary to increase the thickness of the element separating region 15, as shown in FIG. 28. However, these measures are not desirable because the processing is rendered difficult or the withstand voltage of the bonding is lowered. Another method is shown in FIG. 29A and FIG. 30A. In this case, the gate electrode is divided on the element isolating region 15, and the gate electrode is connected to the upper wiring 21 via a contact hole 20 in place of connecting the adjacent transistors by the gate electrode. In this method, however, a region for forming the contact hole 20 above the element separating region 15 is required, resulting in an increase in the peripheral circuit region. The sixth embodiment of the present invention permits overcoming the particular problem. Specifically, in the sixth embodiment of the present invention, the inversion voltage of the element separating region 15 can be increased without increasing the peripheral circuit region by forming the insulating film 16 in a part of the region between the first and second electrode layers 13, 18 and by forming the contact hole 20 above the element region 15.

Incidentally, the sixth embodiment of the present invention can also be applied to the case where the control gate of the memory cell is of a two-layer structure consisting of the second electrode layer 18a and the third electrode layer 18b as in the second and third embodiments described previously.

[Seventh Embodiment]

A seventh embodiment of the present invention is featured in that the widths of the open portions of the insulating films are made equal to each other in a plurality of peripheral circuit transistors.

Figure 31:
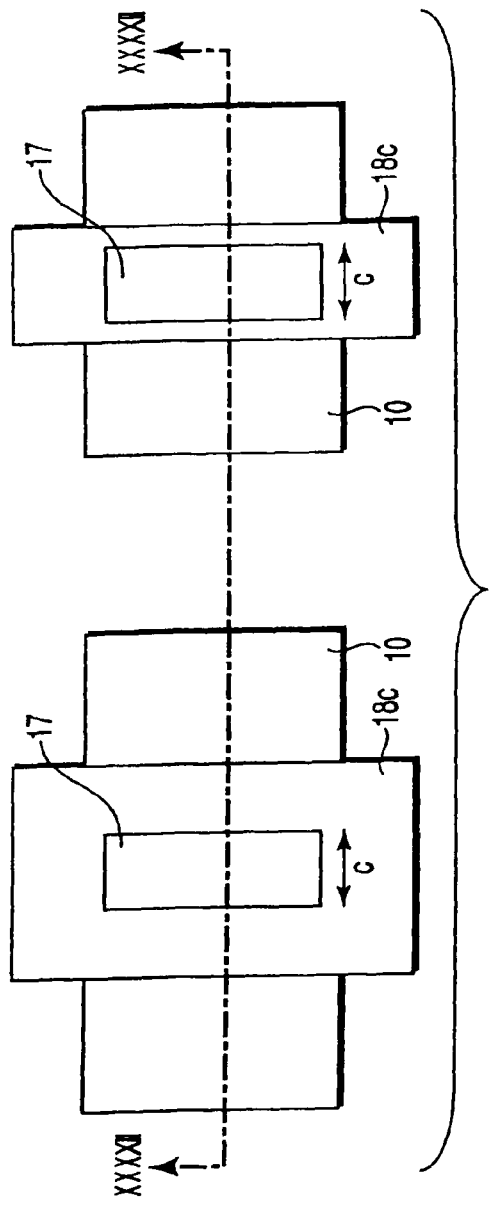
FIG. 31 is a plan view showing a semiconductor device according to a seventh embodiment of the present invention.
Figure 32:
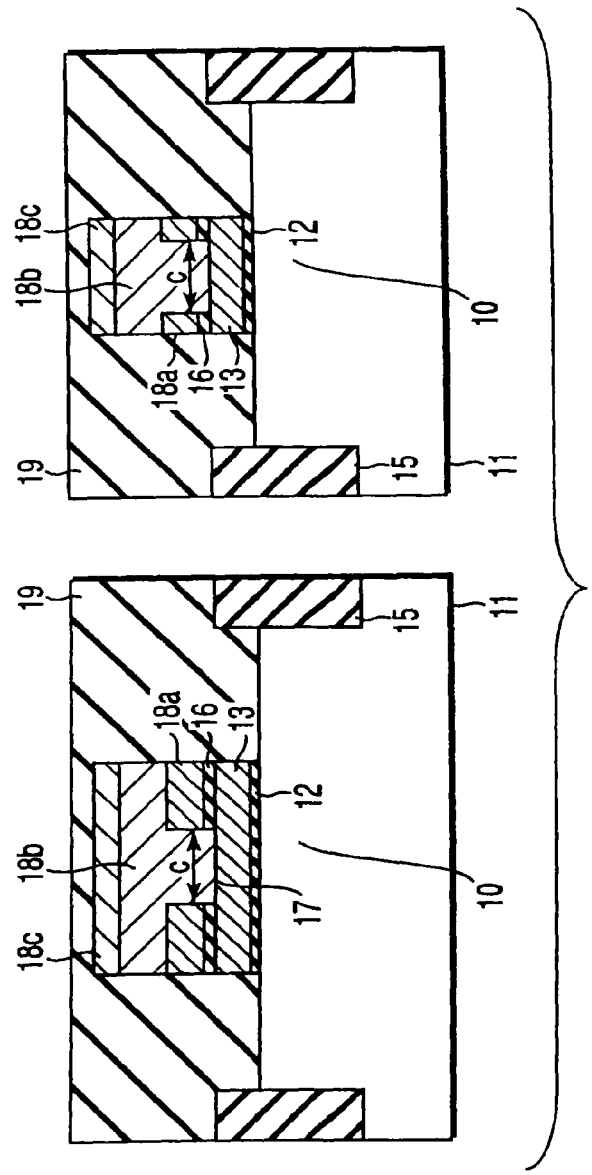
FIG. 32 is a cross sectional view of the semiconductor device along the line XXXII-XXXII shown in FIG. 31.

FIG. 31 is a plan view showing a semiconductor device according to the seventh embodiment of the present invention, and FIG. 32 is a cross sectional view of the semiconductor device along the lines XXXII-XXXII shown in FIG. 31. The characterizing part alone of the seventh embodiment will now be described.

As shown in FIGS. 31 and 32, in a plurality of transistors arranged on the chip, each of the second insulating film 16 formed on the first electrode layer 13 and the second electrode layer 18a has an open portion 17 exposing partly the surface of the first electrode layer 13. A third electrode layer 18b is formed within the open portion 17 and on the second insulating film 16, and a fourth electrode layer 18c is formed on the third electrode layer 18. In the transistor having a gate electrode consisting of the first to fourth electrode layers 13, 18a, 18b and 18c, the widths c of all the open portions 17 are made equal to each other.

The seventh embodiment produces effects similar to those produced by the fourth embodiment and additional effects as described below.

The widths c of the open portions 17 in all the gate electrodes on the chip are made equal to each other. As a result, where the open portions 17 are filled with the third electrode layer 18b, it is possible to suppress to the minimum level the nonuniformity in the stepping of the third electrode layer 18b. It follows that the seventh embodiment is adapted for depositing flat the third electrode layer 18b.

It should also be noted that If the widths c of the open portions 17 are made equal to each other, the patterning by the lithography can be controlled easily in forming the open portions 17.

Further, the seventh embodiment of the present invention makes it possible to suppress the dimensional nonuniformity of the widths c of the open portions 17.

[Eighth Embodiment]

An eighth embodiment is featured in that a plurality of open portions are formed in the same gate electrode and the widths of these open portions are made equal to each other.

Figure 33:
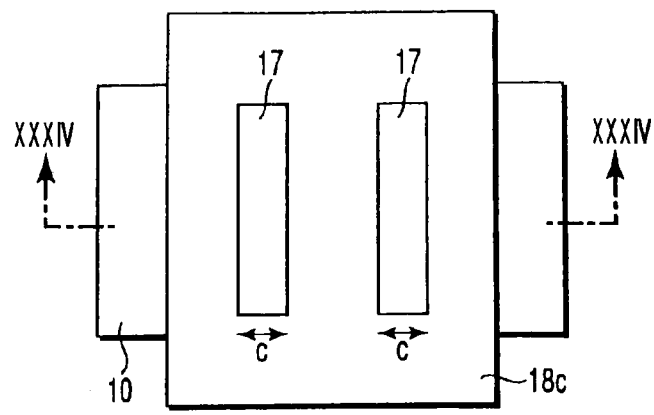
FIG. 33 is a plan view showing a semiconductor device according to an eighth embodiment of the present invention.
Figure 34:
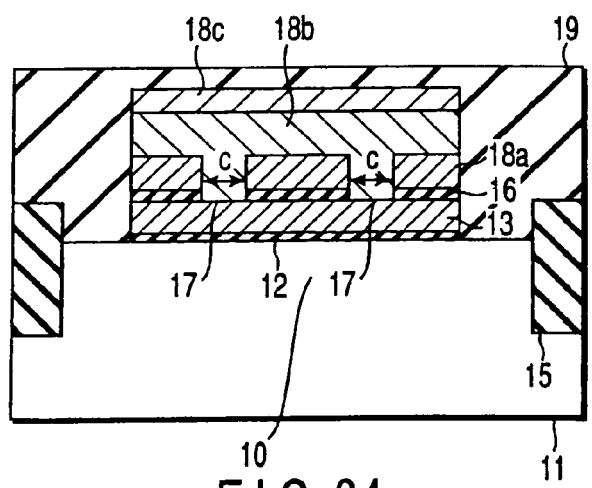
FIG. 34 is a cross sectional view of the semiconductor device along the line XXXIV-XXXIV shown in FIG. 35.

FIG. 33 is a plan view showing a semiconductor device according to the eighth embodiment of the present invention, and FIG. 34 is a cross sectional view of the semiconductor device along the line XXXIV-XXXIV shown in FIG. 33. The characterizing portion alone of the eighth embodiment will now be described.

As shown in FIGS. 33 and 34, in the gate electrode of the transistor, a plurality of open portions 17 each exposing a part of the surface of the first electrode layer 13 are formed in each of a second insulating film 16 and a second gate electrode 18a formed on the first electrode layer 13. A third electrode layer 18b is formed within these open portions 17 and on the second insulating film 16. Further, a fourth electrode layer 18c is formed on the third electrode layer 18b. It should be noted that the widths c of the plural open portions 17 in the same gate electrode are equal to each other.

According to the eighth embodiment of the present invention, since the widths c of the open portions 17 are equal to each other, it is possible to obtain the effects similar to those produced by the seventh embodiment.

Further, a plurality of open portions 17 are formed in the same gate electrode so as to increase the connection area between the first electrode layer 13 and the third electrode layer 18b. As a result, it is possible to decrease the contact resistance between the first electrode layer 13 and the third electrode layer 18b.

Figure 35:
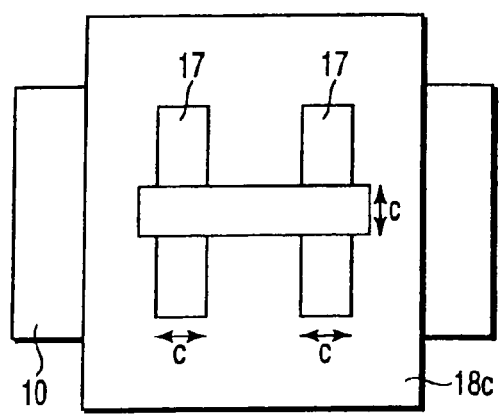
FIG. 35 is a plan view showing the other semiconductor device according to the eighth embodiment of the present invention.

Incidentally, in forming a plurality of open portions within the same gate electrode, it is possible to form the open portions 17 in the cross (+) shape as shown in FIG. 35. By forming the open portions 17 in the cross shape, more open portions 17 can be formed in the same gate electrode, making it possible to further increase the connection area and to further decrease the contact resistance.

[Ninth Embodiment]

Figure 36:
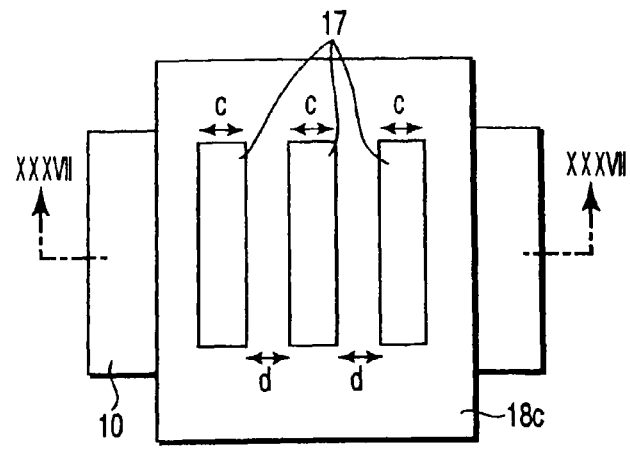
FIG. 36 is a plan view showing a semiconductor device according to a ninth embodiment of the present invention.
Figure 37:
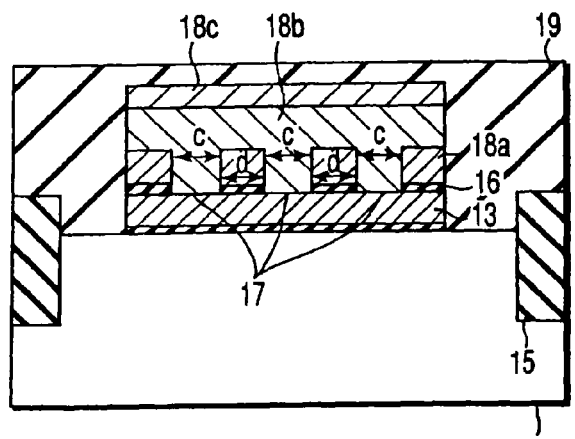
FIG. 37 is a cross sectional view of the semiconductor device along the line XXXVII-XXXVII shown in FIG. 36.

An ninth embodiment is featured in that, in forming a plurality of open portions in the same gate electrode as in the eighth embodiment distances between the adjacent open portions 17 are made uniform. FIG. 36 is a plan view showing a semiconductor device according to the ninth embodiment of the present invention and FIG. 37 is a cross sectional view of the semiconductor device along the line XXXVII-XXXVII shown in FIG. 36. The characterizing portion alone of the ninth embodiment will now be described.

As shown in FIGS. 36 and 37, a plurality of open portions 17 each exposing partly the surface of the first electrode layer 13 are formed in each of the second insulating film 16 formed on the first electrode layer 13 and the second electrode layer 18a formed on the second insulating film 16 in the gate electrode of the transistor. Further, a third electrode layer 18b is formed within the open portions 17 and on the second insulating film 16, and a fourth electrode layer 18c is formed on the third electrode layer 18b. It should be noted that the widths c of the plural open portions in the same gate electrode are equal to each other. Also, the distances d between the adjacent open portions 17 are equal to each other.

According to the ninth embodiment of the present invention, since a plurality of open portions 17 are formed and the widths c of these open portions are equal to each other, it is possible to obtain the effects similar to those obtained in the seventh and eighth embodiments described previously.

Figure 38:
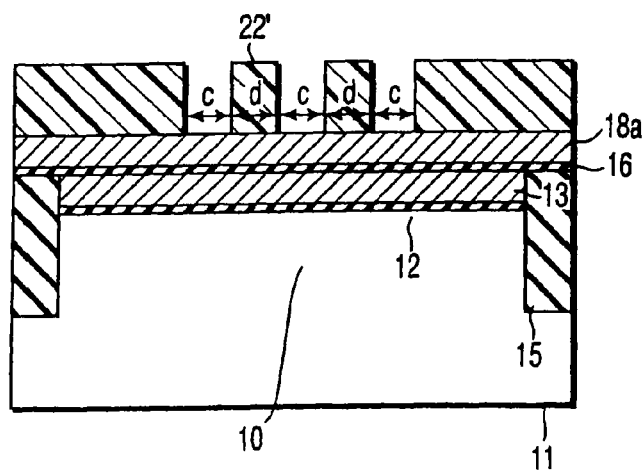
FIG. 38 is a cross sectional view showing the semiconductor device according to the ninth embodiment of the present invention.

Further, the distances d between the adjacent open portions 17 formed in the gate electrode are equal to each other. It should be noted that, in order to form the open portions 17 at a uniform interval, it is necessary to form the light exposure portions at the same width in the lithography step for forming the open portions 17, as shown in FIG. 38. It follows that it is possible to suppress to the minimum level the processing nonuniformity of a resist 22' caused by the light proximity effect at the adjacent light exposure portion.

It is possible to apply the ninth embodiment of the present invention to a NAND type flash memory.

Figure 39B:
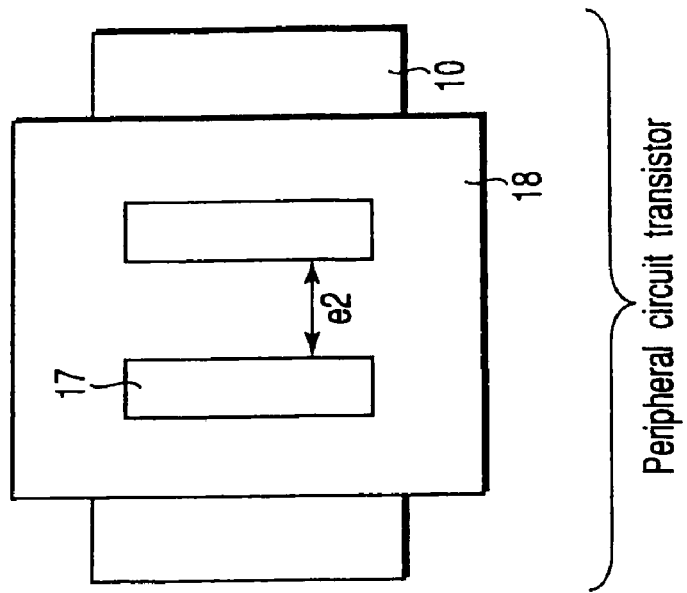
FIG. 39B is a plan view showing the peripheral circuit transistor of the semiconductor device according to the ninth embodiment of the present invention.
Figure 39A:
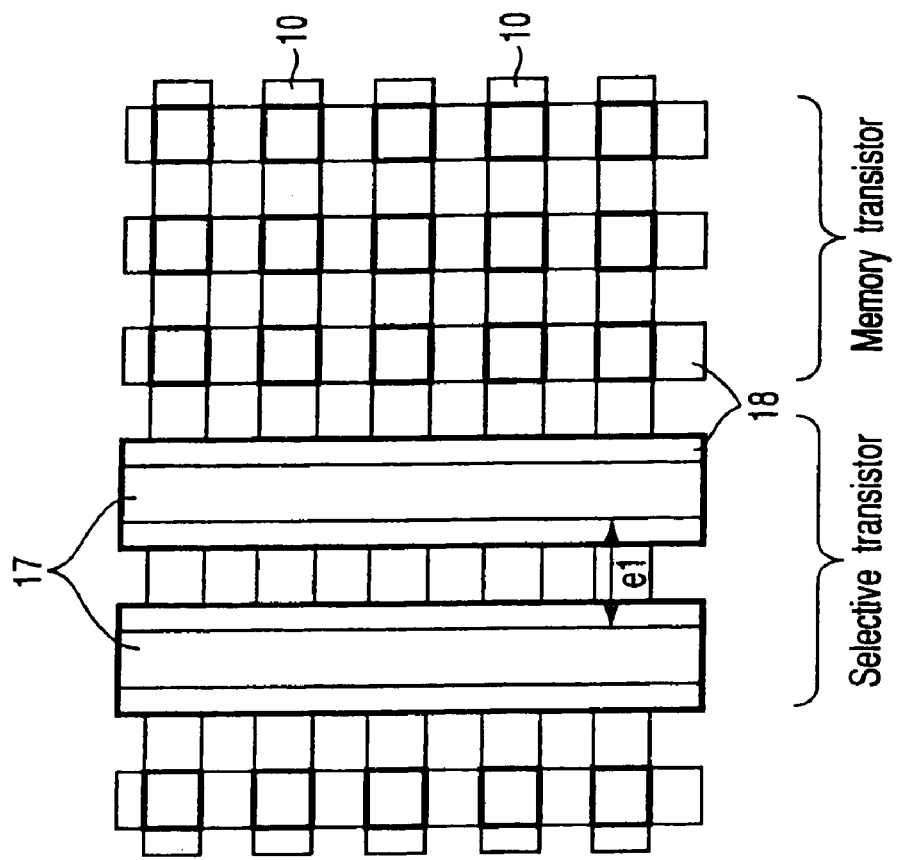
FIG. 39A is a plan view showing a memory transistor and a selective gate transistor of the semiconductor device according to the ninth embodiment of the present invention.

In the NAND type flash memory, the selective transistor and the peripheral circuit transistor, which differ from each other in the gate length, are formed in same chip, as shown in FIGS. 39A and 39B. In this case, the distance e1 between the adjacent open portions 17 formed in each of a plurality of selective gate transistors is made equal to the distance e2 between the adjacent open portions 17 formed in the same gate electrode of the peripheral circuit transistor. As a result, it is possible to suppress to the minimum level the processing nonuniformity of the resist 22' shown in FIG. 38 within the same chip.

In general the size of the selective transistor is smaller than that of the peripheral circuit transistor. Therefore, in order to miniaturize the element, it is advisable to determine the distances e1 and e2 noted above such that the distance e2 between the adjacent open portions in the peripheral circuit transistor is determined in accordance with the distance e1 between the open portions 17 in the selective transistor on the basis of the distance e1 noted above.

[Tenth Embodiment]

A tenth embodiment is featured in that the open portion is allowed to extend from above the element region onto the element isolating region in the direction of the channel width.

Figure 40A:
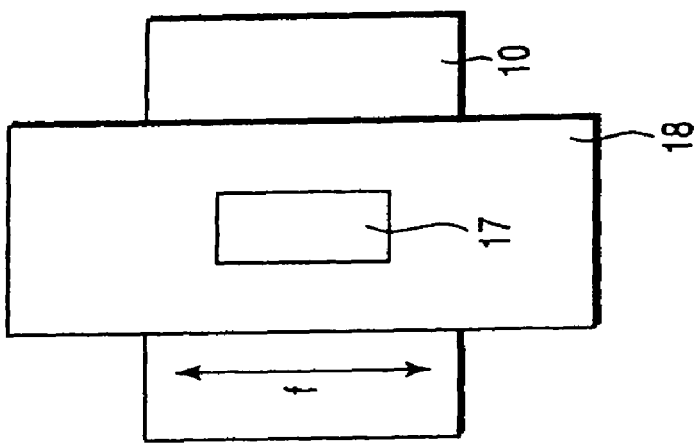
FIG. 40A is a plan view showing a semiconductor device according to the prior art.
Figure 40B:
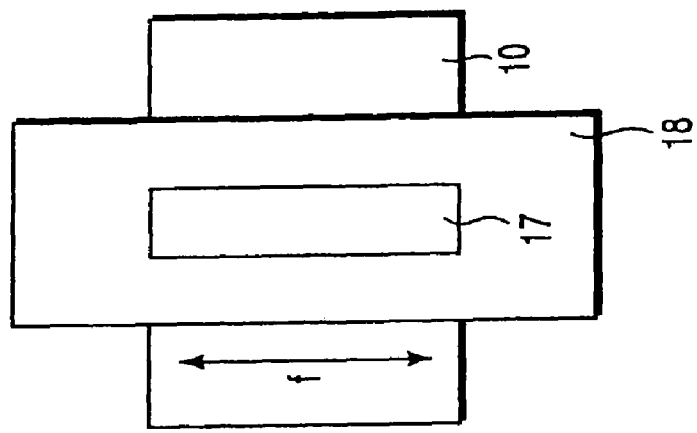
FIGS. 40B and 40C are plan views collectively showing a semiconductor device according to a tenth embodiment of the present invention.
Figure 40C:
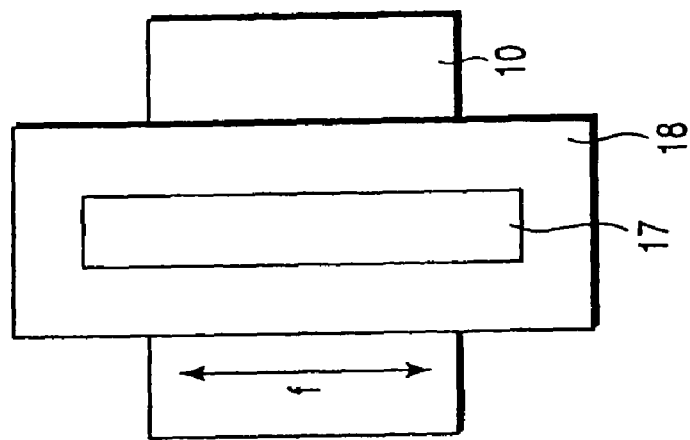

FIG. 40A is a cross sectional view showing the semiconductor device according to the fourth embodiment of the present invention. FIGS. 40B and 40C are cross sectional views collectively showing a semiconductor device according to the tenth embodiment of the present invention. The characterizing portion of the tenth embodiment will now be described.

In the fourth embodiment, etc. described previously, the open portion 17 is formed within the element region 10 as shown in FIG. 40A. In the tenth embodiment however, the open portion 17 is formed to extend from within the element region 10 to reach the edge portion of the element region 10, as shown in FIG. 40B. Also, the open portion 17 is formed to extend from Within the element region 10 onto the element isolating region 15, as shown in FIG. 40C. The open portion 17 extends in the direction of the channel width f of the gate electrode.

According to the ninth embodiment of the present invention, which produces the effect similar to that obtained in the fourth embodiment.

Further, the open portion 17 is allowed to extend from above the element region 10 onto the element isolating region 15 in the direction of the channel width f. As a result, the open portion 17 can be formed without being restricted by the limit of the processing of the lithography even in the case of a transistor having a small channel width f.

[Eleventh Embodiment]

An eleventh embodiment is featured in that defined is the relationship between the width of the open portion and the thickness of the electrode layer deposited in a manner to fill the open portion.

Figure 41A:
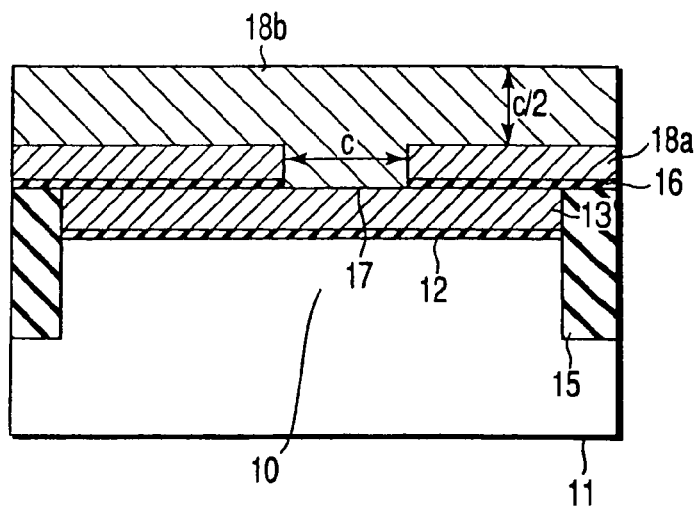
FIGS. 41A and 41B are cross sectional views collectively showing a semiconductor device according to a eleventh embodiment of the present invention.
Figure 41B:
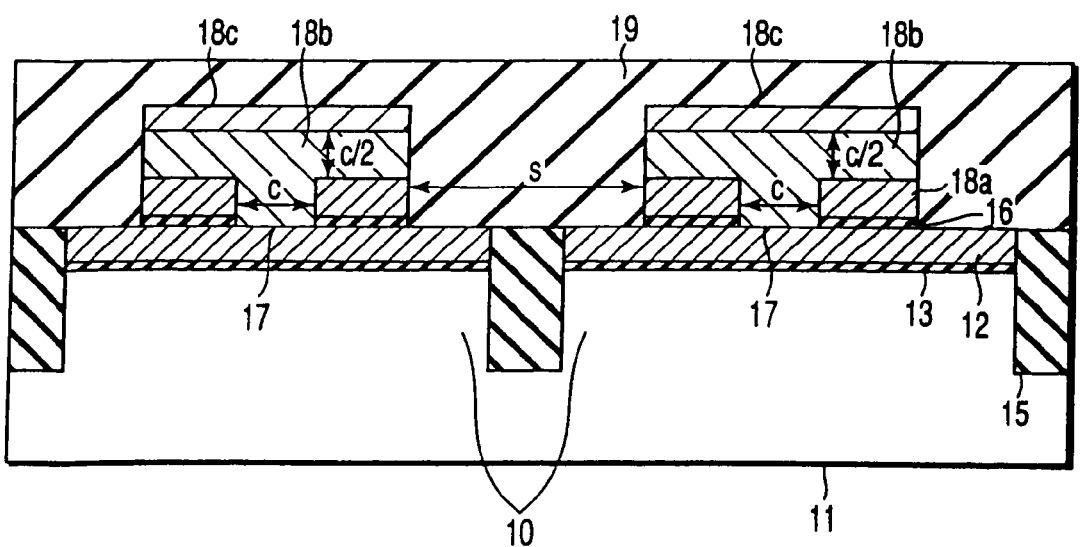

FIGS. 41A and 41B are cross sectional views collectively showing a semiconductor device according to the eleventh embodiment of the present invention. The characterizing portion of the eleventh embodiment will now be described.

As shown In FIGS. 41A and 41B, an open portion 17 is formed in each of a second insulating film 16 formed on the first insulating layer 13 and a second electrode layer 18a formed on the second insulating film 16 in each of a plurality of transistors arranged on the chip. Also, a third electrode layer 18b is formed within the open portion 17 and on the second insulating film 16. It should be noted that the widths c of the open portions formed in these transistors are equal to each other. Also, in this case, the thickness of the third electrode layer 18b when deposited is at least half the width c of the open portion 17. It is possible to decrease the width c of the open portion 17 by employing the method described previously in conjunction with the third embodiment of the present invention.

According to the eleventh embodiment of the present invention, which produces the effect similar to that obtained in the fourth embodiment.

Further, the widths c of the open portions of the transistors are made equal to each other, and the thickness of the third electrode layer 18b when deposited is set at a value not smaller than c/2. As a result, the open portion 17 is filled completely with the third electrode layer 18b without fail, and the third electrode layer 18c can be deposited in manner to have a smooth upper surface.

It should also be noted that, since the width c of the open portion 17 is made small, it is possible to decrease the thickness of the third electrode layer 18b required for allowing the surface of the third electrode layer 18b to be smooth. It follows that it is possible to decrease the total height of the gate electrode. As a result, the aspect ratio of the space S of the gate electrode of the memory cell array region is diminished so as to make it possible to bury easily a third insulating film 19 for insulating the upper wiring (not shown) and the gate electrode in the space s of the gate electrode, as shown in FIG. 41B.

Since the eleventh embodiment produces the particular effects described above, it is possible to avoid the problems described below.

Figure 42A:
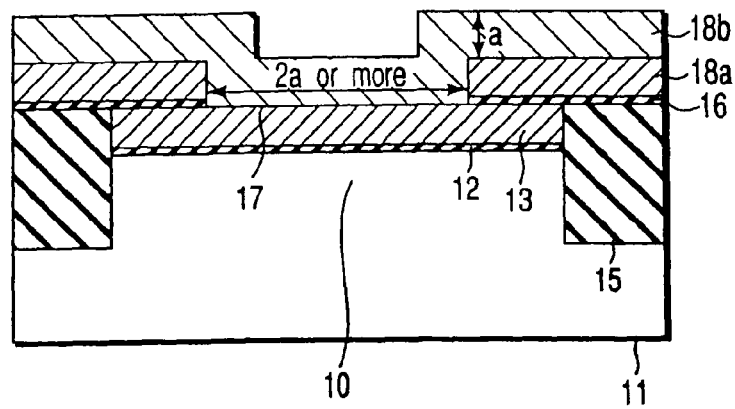
FIGS. 42A, 42B, 42C, 43A and 43B are cross sectional views collectively showing a conventional semiconductor device.

The first problem is that, where the width of the open portion 17 is at least twice the deposition thickness a of the third electrode layer 18b, a stepped portion is formed on the surface of the third electrode layer 18b on the open portion 17, if the third electrode layer 18b is deposited within the open portion 17, as shown in FIG. 42A.

Figure 42B:
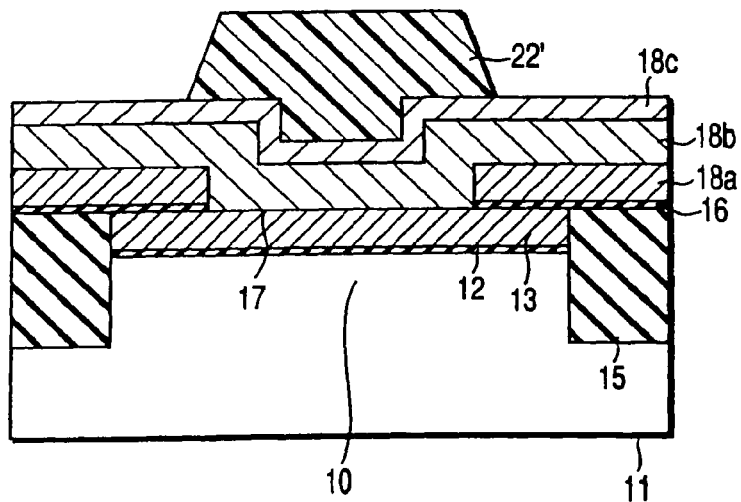

The second problem is that a fourth electrode layer 18c, e.g., a WSi layer, is formed on the third electrode layer 18b, followed by forming a resist 22' on the fourth electrode layer 18c, as shown in FIG. 42B. When the resist 22' is patterned by the lithography technology for forming the gate electrode, a stepped portion is formed in the third electrode layer 18b. What should be noted is that a focus deviation is brought about by the stepped portion, resulting in failure to form the resist 22' in a desired shape. It follows that the finished shape after processing of the gate electrode is rendered partially different in size.

Figure 42C:
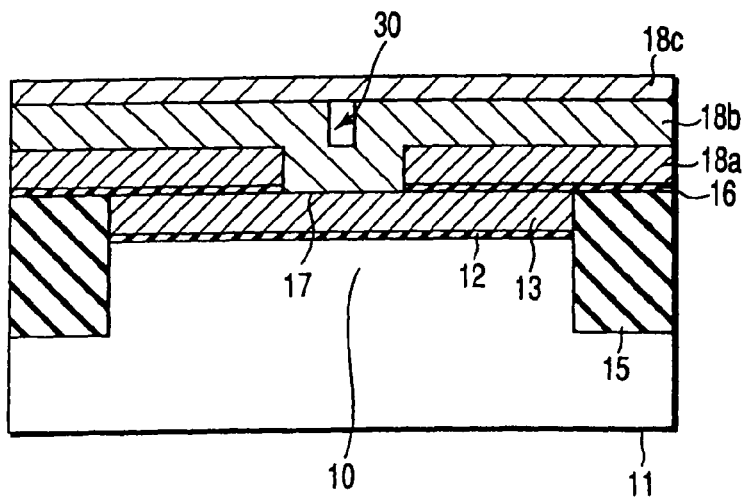

The third problem is that, where a fourth electrode layer 18c is deposited on the third electrode layer 18b as shown in FIG. 42C, the stepped portion generated when the third electrode layer 18b is deposited tends to cause a region 30 that does not fill the stepped portion to be formed on the third electrode layer 18b on the open portion 17.

Figure 43A:
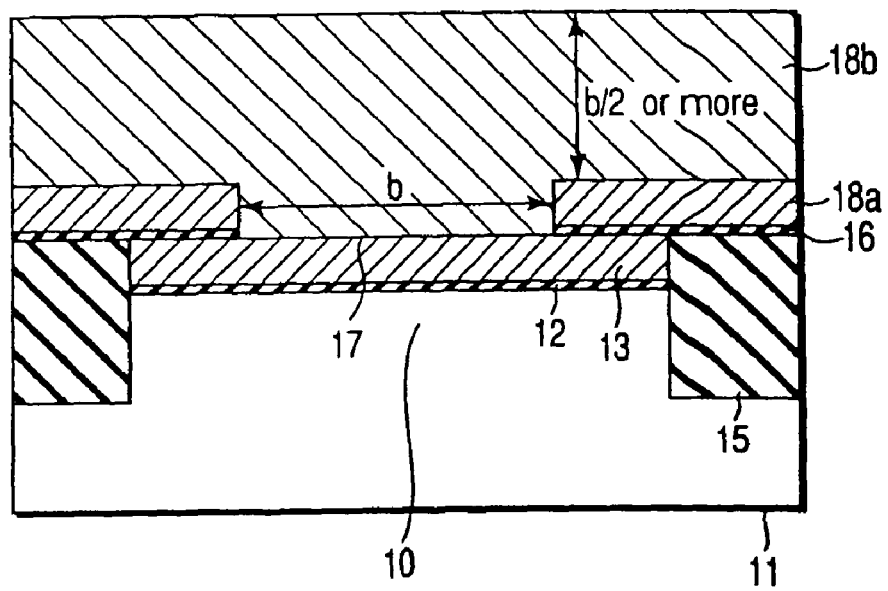

The fourth problem is that, in order to deposit the third electrode layer 18b in a manner to have a flat surface in all the transistors differing from each other in the gate length, it is necessary for the deposition thickness of the third electrode layer 18b to be at least half the maximum width of the open portion so as to fill the open portion having the maximum width of the open portion as shown in FIG. 43A, if the widths of the open portions of the transistors are nonuniform. As a result, the deposition thickness of the third electrode layer 18b is increased so as to make it difficult to process the gate electrode.

Figure 43B:
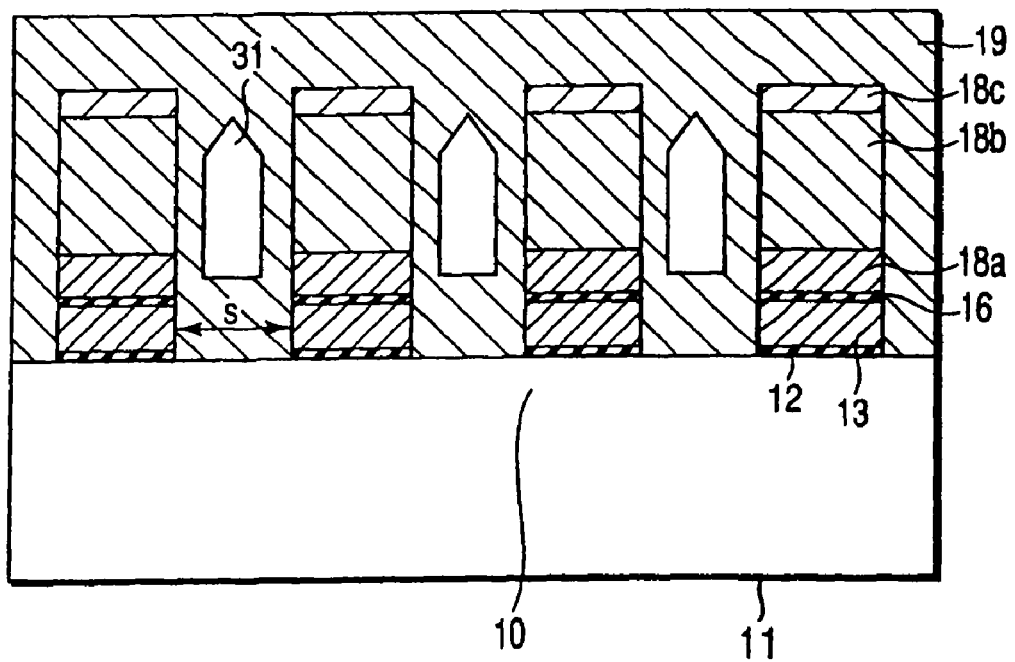

The fifth problem is that, if the deposition thickness of the third electrode layer 18b is increased as pointed out in conjunction with the fourth problem, the space s between the adjacent gate electrodes is formed in the memory cell array region in a manner to have a high aspect ratio as shown in FIG. 43B. As a result, it is rendered difficult to fill sufficiently the space S with an interlayer insulating film 19 for insulating the upper wiring (not shown) and the element region 10, giving rise to generation of a void 31.

[Twelfth Embodiment]

A twelfth embodiment is featured in that the relationship between the width of the open portion and the thickness of the electrode layer filling the open portion is defined and a treatment to planarize the surface of the electrode layer is applied.

Figure 44A:
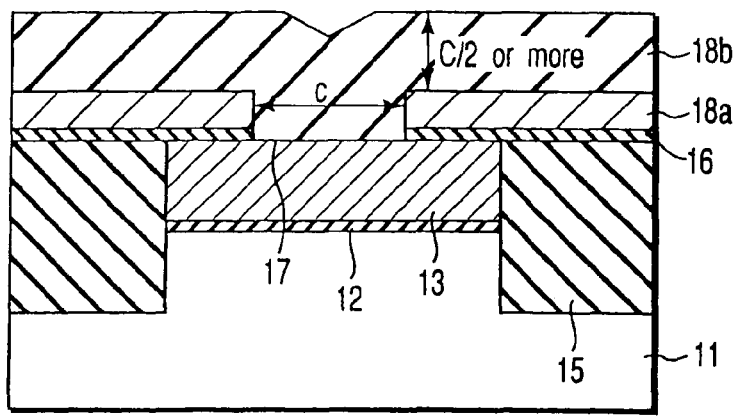
FIGS. 44A and 44B are cross sectional views collectively showing the manufacturing process of the semiconductor device according to a twelfth embodiment of the present invention.
Figure 44B:
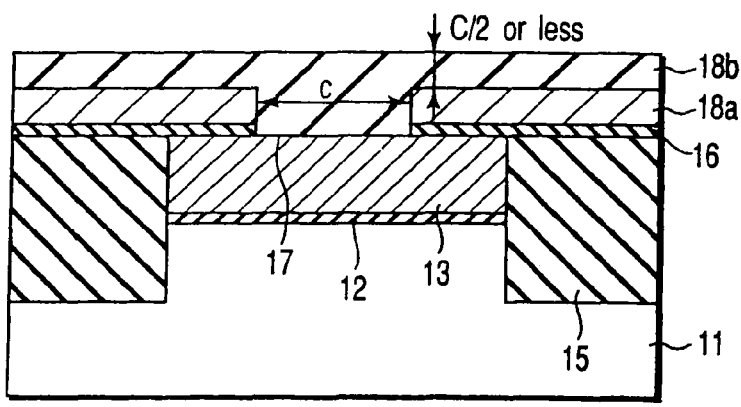
Figure 45:
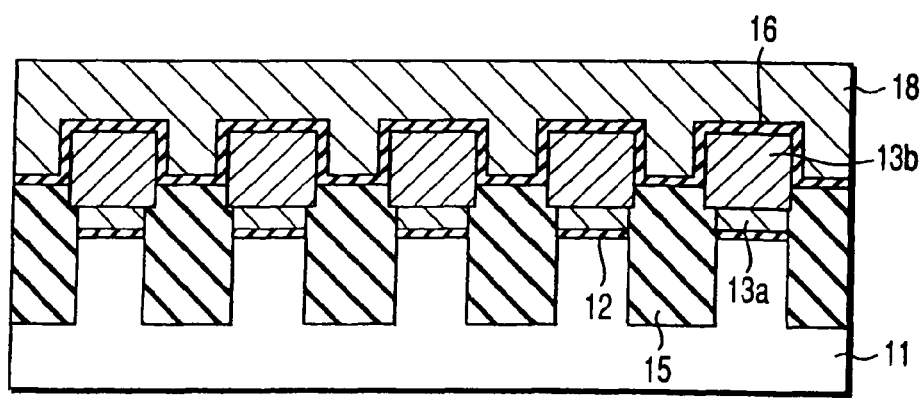
FIG. 45 is a cross sectional view showing the other semiconductor device according to the each embodiment of the present invention.
Figures 46A, 46B:
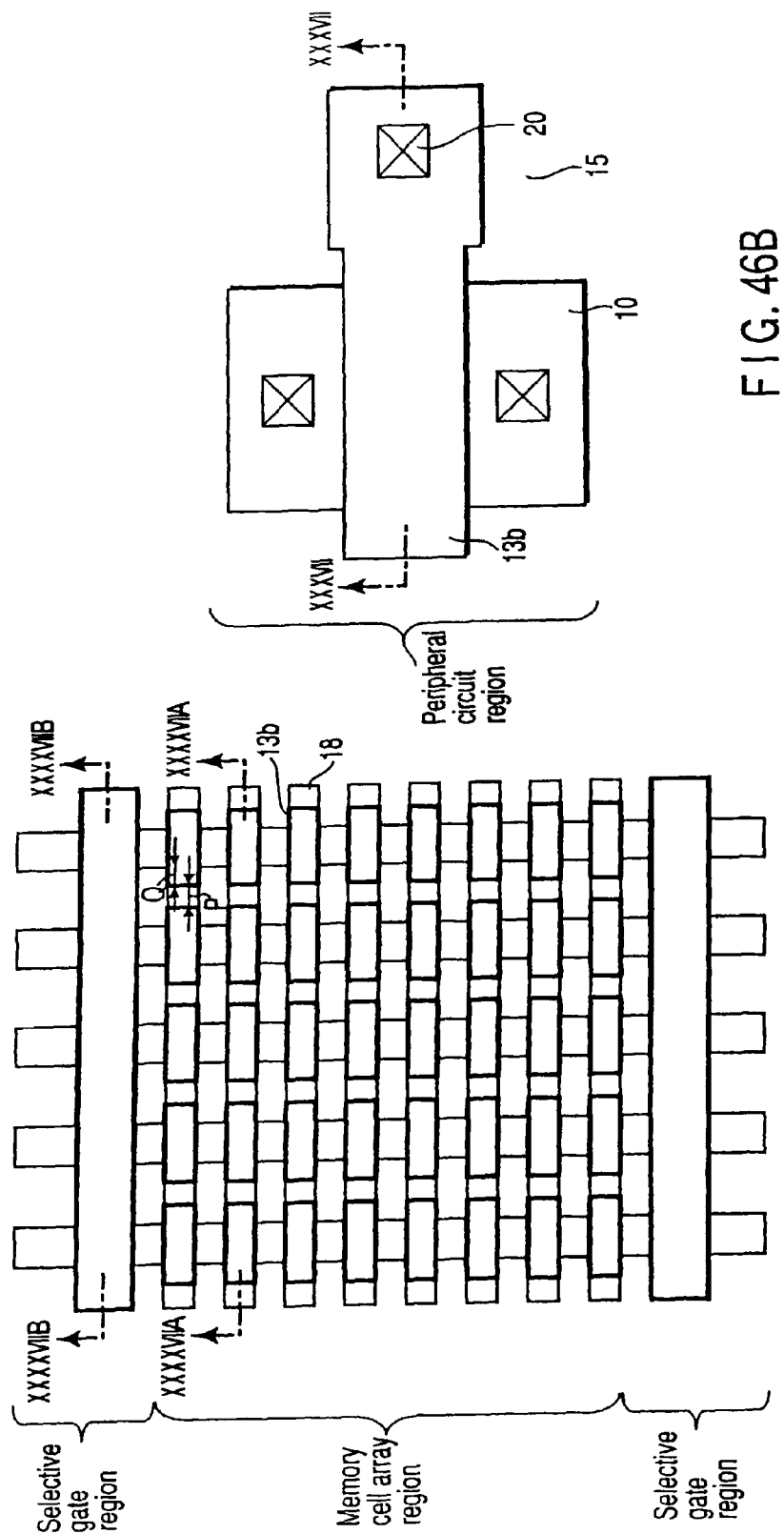
FIG. 46A is a plan view showing the memory cell array region and the selective gate region of the semiconductor device according to the first prior art.
FIG. 46B is a plan view showing the peripheral circuit region of the semiconductor device according to the first prior art.
Figure 47A:
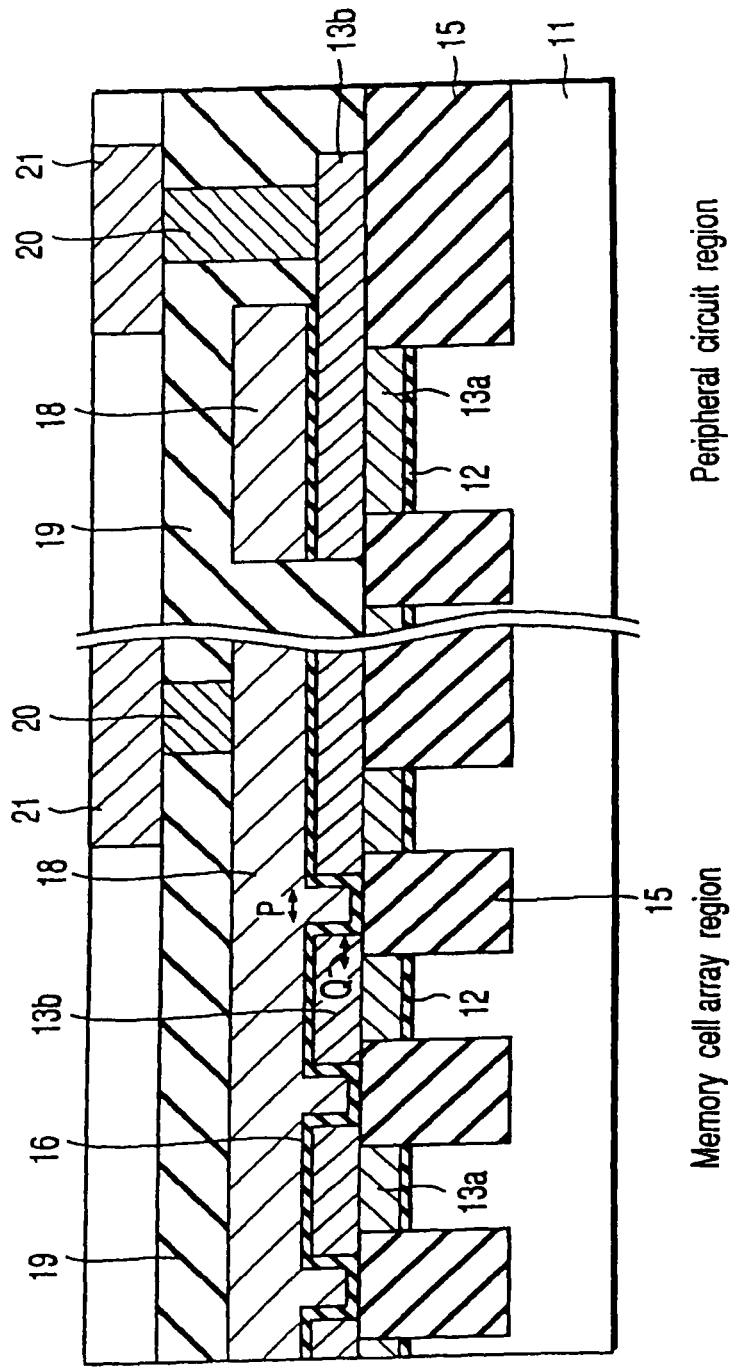
FIG. 47A is a cross sectional view of the semiconductor device along the line XXXXVIIA-XXXXVIIA shown in FIGS. 46A and 46B.
Figure 47B:
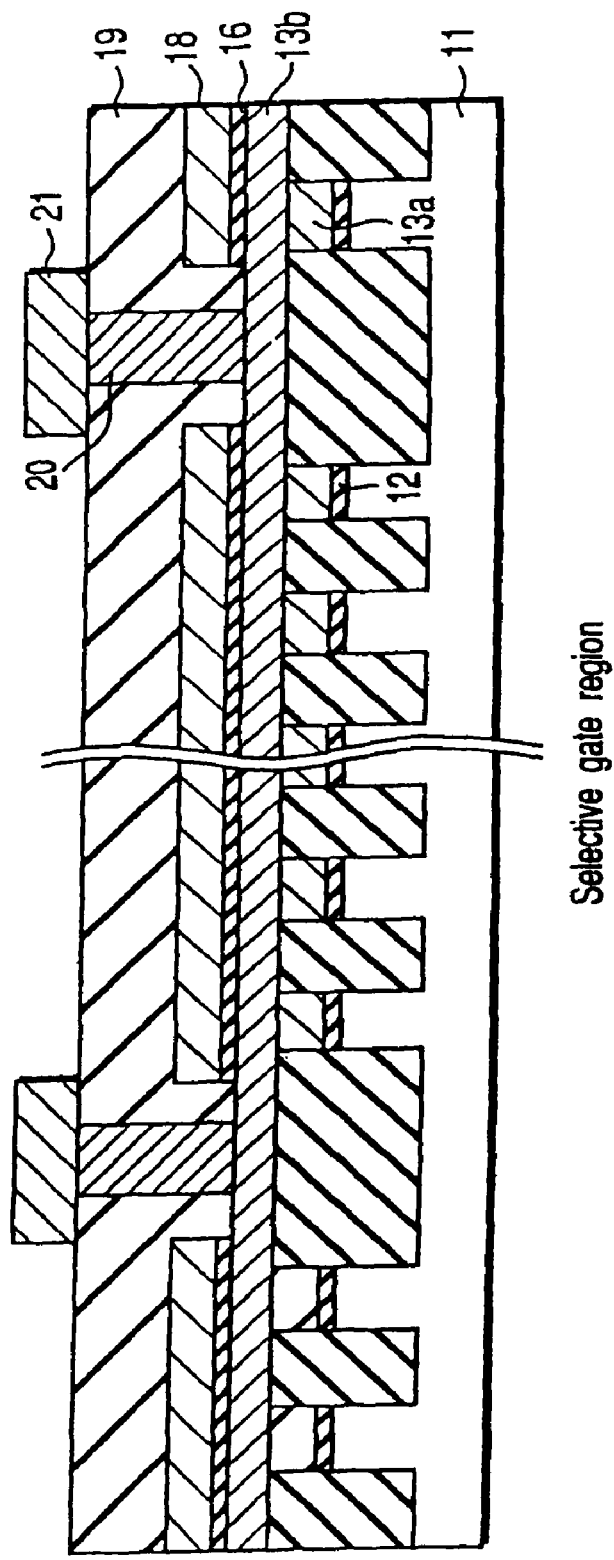
FIG. 47B is a cross sectional view of the semiconductor device along the line XXXXVIIB-XXXXVIIB shown in FIG. 46A.
Figures 48A, 48B:
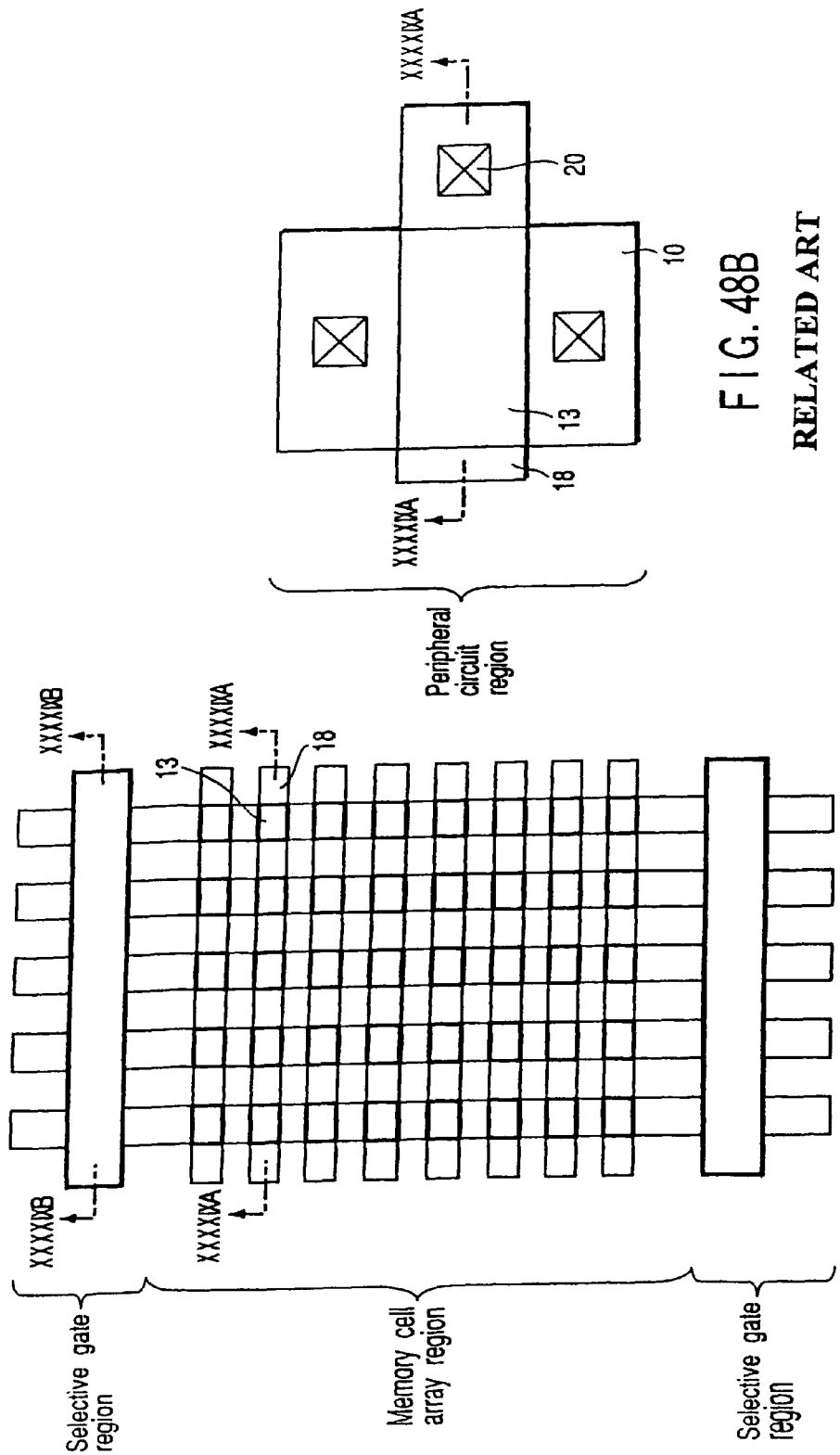
FIG. 48A is a plan view showing the memory cell array region and the selective gate region of the semiconductor device according to the second prior art.
FIG. 48B is a plan view showing the peripheral circuit region of the semiconductor device according to the second prior art.
Figure 49A:
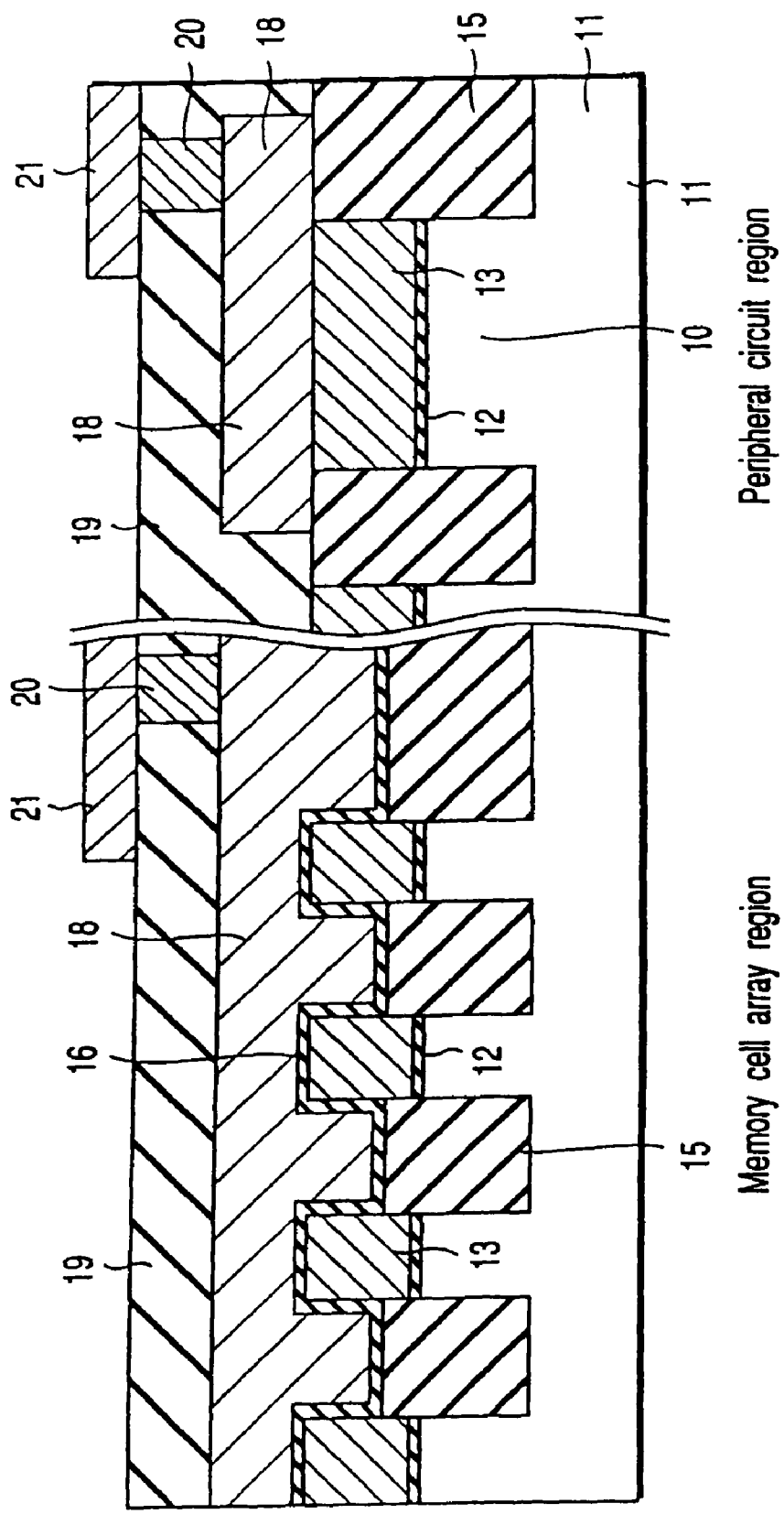
FIG. 49A is a cross sectional view of the semiconductor device along the line XXXXIXA-XXXXIXA shown in FIGS. 48A and 48B.
Figure 49B:
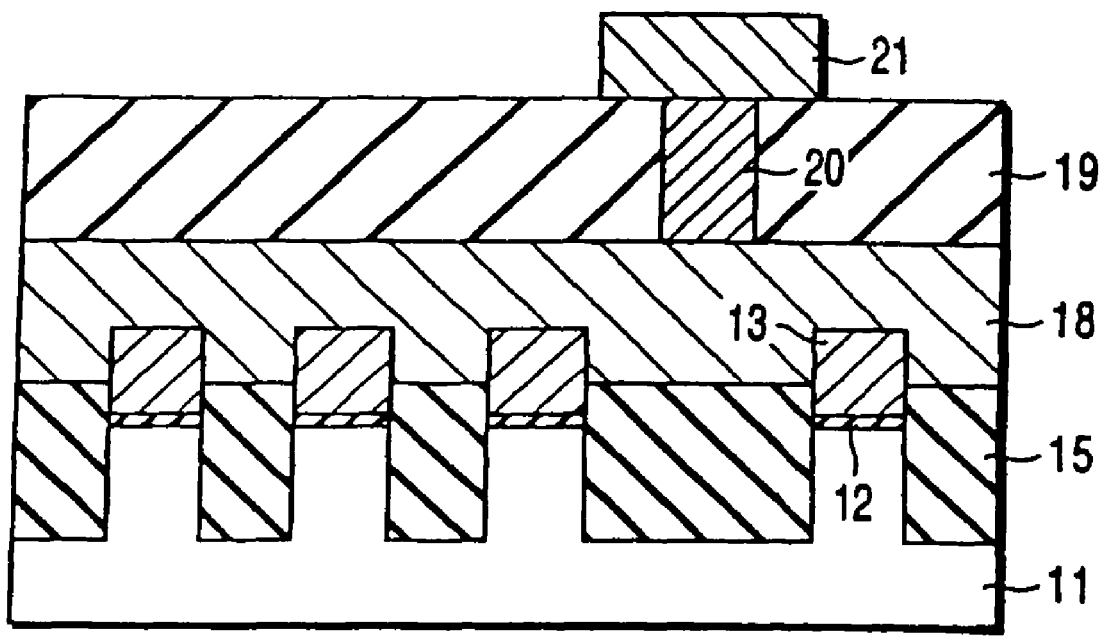
FIG. 49B is a cross sectional view of the semiconductor device along the line XXXXIXB-XXXXIXB shown in FIG. 48A.

FIGS. 44A and 44B are cross sectional views collectively showing a semiconductor device according to the twelfth embodiment of the present invention. The characterizing portion of the twelfth embodiment will now be described.

As shown in FIG. 44A, the width c of the open portion 17 is set constant, and the third electrode layer 18b is deposited in a thickness not smaller than half the width c of the open portion as in the eleventh embodiment. Then, as shown in FIG. 44B, the surface of the third electrode 18b is planarized by CDE (Chemical Dry Etching) or CMP 25 (Chemical Mechanical Polish).

According to the twelfth embodiment of the present invention, which produces the effect similar to that obtained in the eleventh embodiment.

Further, the thickness of the third electrode layer 18b can be made smaller than the thickness in the step of depositing the third electrode layer by planarizing the surface of the third electrode layer 18b by CDE or CMP. In other words, since the total thickness of the gate electrode can be decreased, the clearance between the adjacent gate electrodes can be filled more easily with the third insulating film 19 than in the eleventh embodiment.

Incidentally, in each of the first to twelfth embodiments of the present invention described above, the first electrode layer 13 is of a single layer structure for the sake of brevity. However, it is possible to modify the first electrode layer 13 in various fashions. For example, it is possible for the first electrode layer to be of a two-layer structure consisting of electrode layers 13a and 13b. It is also possible for the first electrode layer to have a two dimensional convex-concave portion. Also, in each of the first to twelfth embodiments described above, the first electrode layer 13 is self-aligned with the element region 10. However, it is possible for the first electrode layer 13 to protrude in a self-aligned fashion from the element region 10 toward the element separating region 15.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed:
1. A semiconductor device comprising:
a semiconductor layer;
a first memory transistor; and
a peripheral circuit transistor,
wherein the first memory transistor comprises:
a first insulating film formed on the semiconductor layer in a memory cell region;
a first electrode layer formed on the first insulating film;
a first element isolating insulator formed to extend through the first electrode layer and the first insulating film to reach an inner region of the semiconductor layer, a top face of the first element isolating insulator being lower than a top face of the first electrode layer;
a second insulating film formed on the first electrode layer and the first element isolating insulator; and
a second electrode layer formed on the second insulating film; and
the peripheral circuit transistor comprises:
a third insulating film formed on the semiconductor layer in a peripheral circuit region;
a third electrode layer formed on the third insulating film;
a second element isolating insulator formed to extend through the third electrode layer and the third insulating film to reach an inner region of the semiconductor layer;
a fourth insulating film formed on the third electrode layer, the fourth insulating film including a first open portion exposing a surface of the third electrode layer; and
a fourth electrode layer formed above the fourth insulating film and on the exposed surface of the third electrode layer, the fourth electrode layer being electrically connected to the third electrode layer via the first open portion,
wherein a height between a surface of the semiconductor layer beneth the first insulating film and the top face of the first element isolating insulator is shorter than a height between the surface of the semiconductor layer beneath the third insulating film and a top face of the second element isolating insulator.

2. The semiconductor device according to claim 1, wherein a bottom face of the first electrode layer is lower than the top face of the first element isolating insulator.

3. The semiconductor device according to claim 1, wherein the second insulating film is formed continuously on the top face and side faces of the first electrode layer and the top face of the first element isolating insulator;
the second insulating film includes a first portion formed on the top face of the first element isolating insulator and a second portion formed on the top face of the first electrode layer; and
the first portion is located below the second portion.

4. The semiconductor device according to claim 1, wherein a bottom face of the second electrode layer above the first element isolating insulator is lower than a bottom face of the second electrode layer above the first electrode layer, and a bottom face of the fourth electrode layer above the second element isolating insulator is substantially equal to a bottom face of the fourth electrode layer on the fourth insulating film on the third electrode layer.

5. The semiconductor device according to claim 1, wherein the top face of the second element isolating insulator is higher than the top face of the first element isolating insulator.

6. The semiconductor device according to claim 1, wherein a height in the second element isolating insulator is greater than a height in the first element isolating insulator.

7. The semiconductor device according to claim 1, wherein the fourth insulating film is formed to extend on the second element isolating insulator.

8. The semiconductor device according to claim 1, wherein a width in the fourth electrode layer is greater than a width in the third electrode layer in a gate width direction of the peripheral circuit transistor.

9. The semiconductor device according to claim 1, further comprising two or more peripheral circuit transistors constituted of the peripheral circuit transistor, first open portions of the peripheral circuit transistors having substantially equal widths in a gate width direction of the peripheral circuit transistors respectively.

10. The semiconductor device according to claim 1, wherein the second and fourth insulating films are insulating films including N.

11. The semiconductor device according to claim 1, wherein the first memory transistor further comprises a fifth electrode layer formed on the second electrode layer, the fifth electrode layer made of metal silicide.

12. The semiconductor device according to claim 1, wherein the semiconductor device is a NAND type flash memory.

13. The semiconductor device according to claim 1, wherein the first open portion has a first width in a gate length direction of the peripheral circuit transistor and a second width in a gate width direction of the peripheral circuit transistor; and the second width is greater than the first width.

14. The semiconductor device according to claim 1, wherein the first open portion is located at a center portion of the third electrode layer.

15. The semiconductor device according to claim 1, further comprising a first selective transistor, wherein the first selective transistor comprises:
a fifth insulating film formed on the semiconductor layer in a selective gate region;
a fifth electrode layer formed on the fifth insulating film;
a third element isolating insulator formed to extend through the fifth electrode layer and the fifth insulating film to reach the inner region of the semiconductor layer;
a sixth insulating film formed on the fifth electrode layer and the third element isolating insulator, the sixth insulating film including a second open portion exposing a surface of the fifth electrode layer; and
a sixth electrode layer formed above the sixth insulating film and on the exposed surface of the fifth electrode layer, the sixth electrode layer being electrically connected to the fifth electrode layer via the second open portion.

16. The semiconductor device according to claim 15, wherein a gate length of the first selective transistor is greater than a gate length of the first memory transistor; and a gate length of the peripheral circuit transistor is greater than the gate length of the first selective transistor.

17. The semiconductor device according to claim 15, wherein the semiconductor device is a NAND type flash memory;

the first selective transistor includes first and second end portions in a direction of a gate length that is substantially perpendicular to a direction in which the sixth electrode layer extends;
the first memory transistor is disposed on a side of the first end portion of the first selective transistor; and
the semiconductor device further comprises:
a second selective transistor having a structure equivalent to that of the first selective transistor, disposed on a side of the second end portion of the first selective transistor, and the sixth electrode layers of the first and second selective transistors being substantially parallel to each other; and
a second memory transistor disposed on a side of the second selective transistor that is opposite to a side where the first selective transistor is disposed, and having a structure equivalent to that of the first memory transistor.

18. The semiconductor device according to claim 15, wherein a bottom face of the sixth electrode layer above the third element isolating insulator is lower than a bottom face of the sixth electrode layer above the fifth electrode layer, and a bottom face of the fourth electrode layer above the second element isolating insulator is substantially equal to a bottom face of the fourth electrode layer on the fourth insulating film on the third electrode layer.

19. The semiconductor device according to claim 15, wherein a top face of the third element isolating insulator is lower than a top face of the fifth electrode layer.

20. The semiconductor device according to claim 15, wherein a top face of the third element isolating insulator is substantially equal in height to the top face of the first element isolating insulator.

21. The semiconductor device according to claim 15, wherein a height of the third element isolating insulator is substantially equal to a height of the first element isolating insulator.

22. The semiconductor device according to claim 15, wherein the top face of the second element isolating insulator is higher than the top face of the first element isolating insulator, and a top face of the third element isolating insulator is substantially equal in height to the top face of the first element isolating insulator.

23. The semiconductor device according to claim 15, wherein a height in the second element isolating insulator is greater than a height in the first element isolating insulator, and a height of the third element isolating insulator is substantially equal to a height of the first element isolating insulator.

24. The semiconductor device according to claim 15, wherein the second open portion extends in a direction of a gate width of the first selective transistor across the third element isolating insulator.

* * * * *